Figure 1:
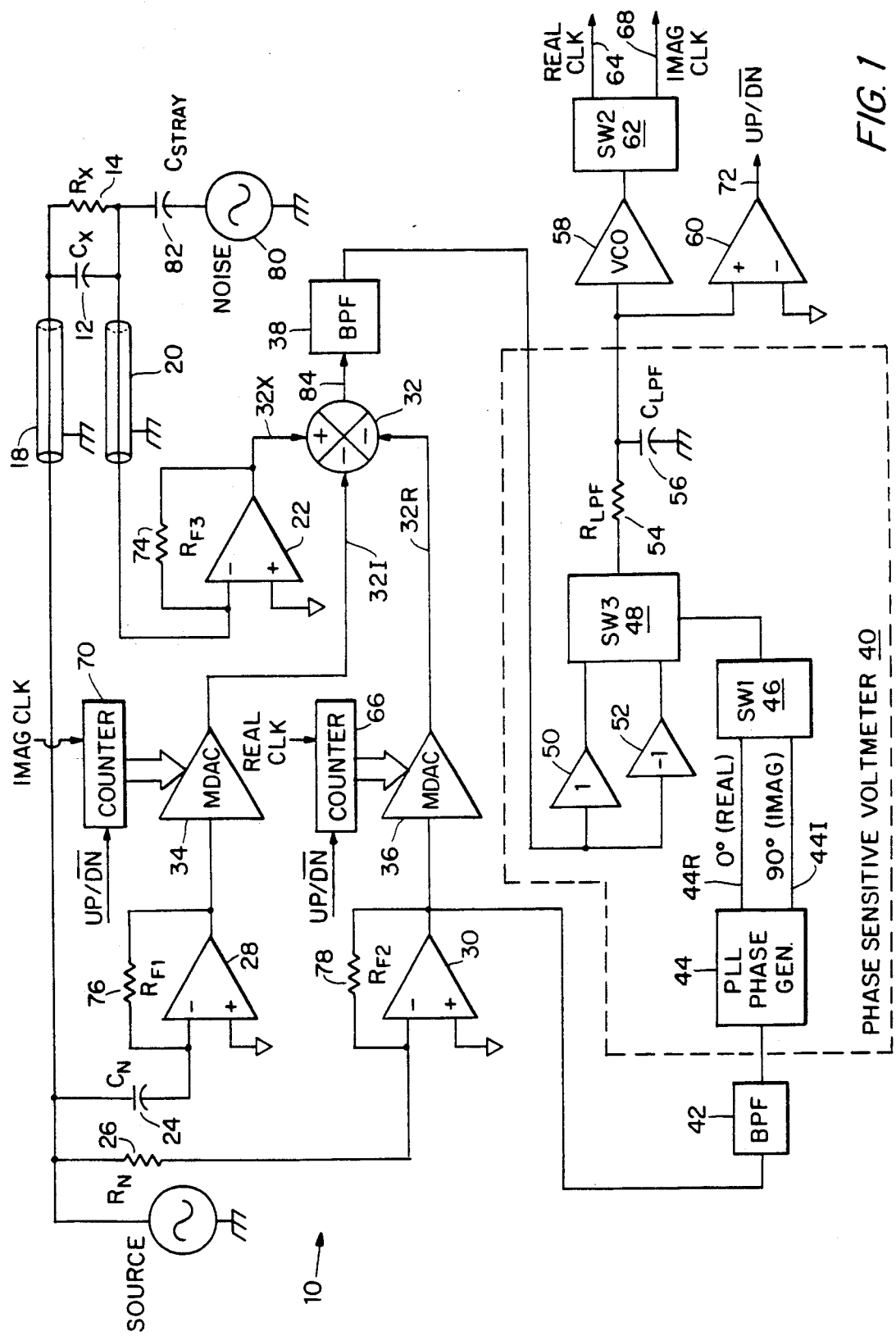
Figure 2A:
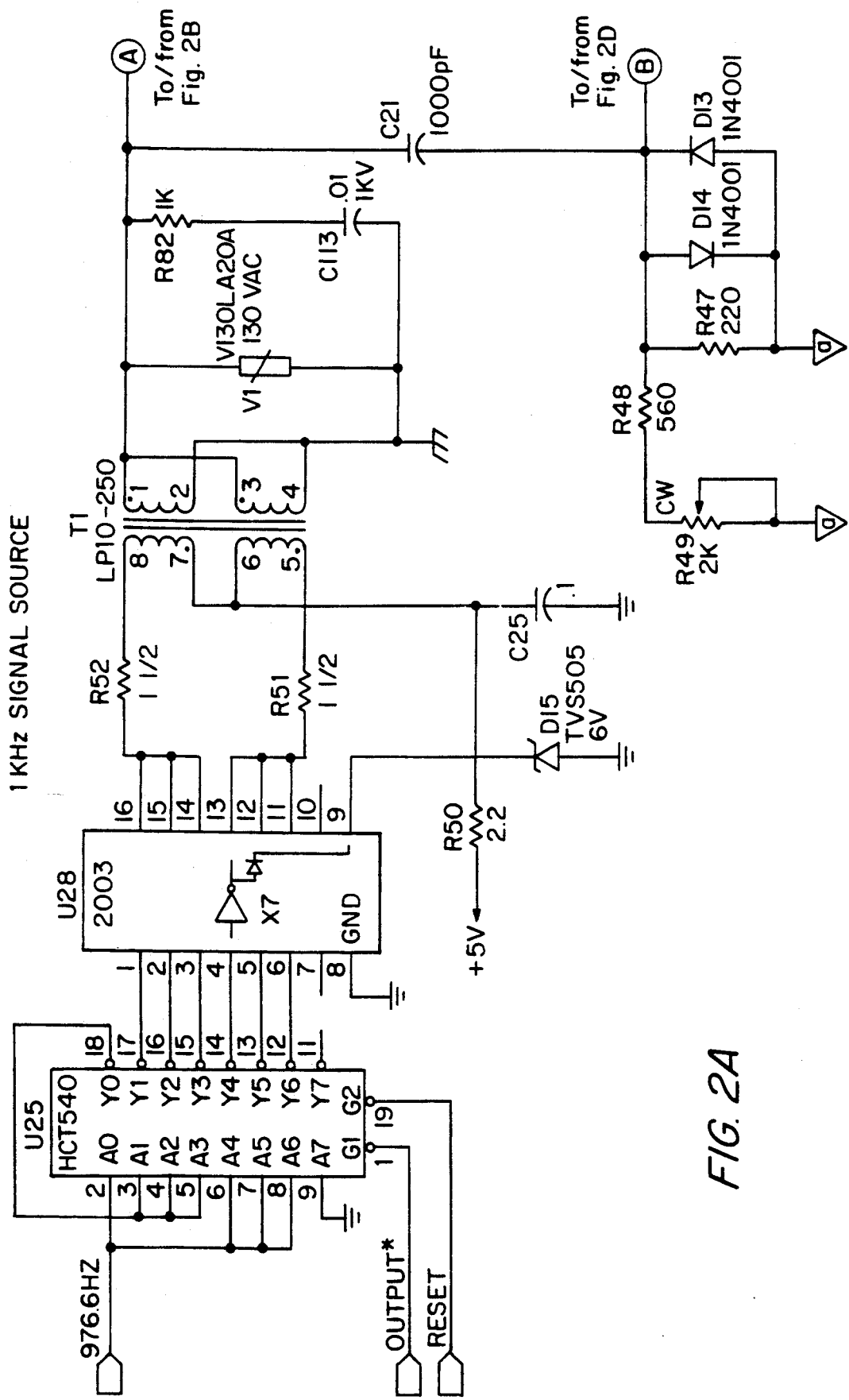
Figure 2B:
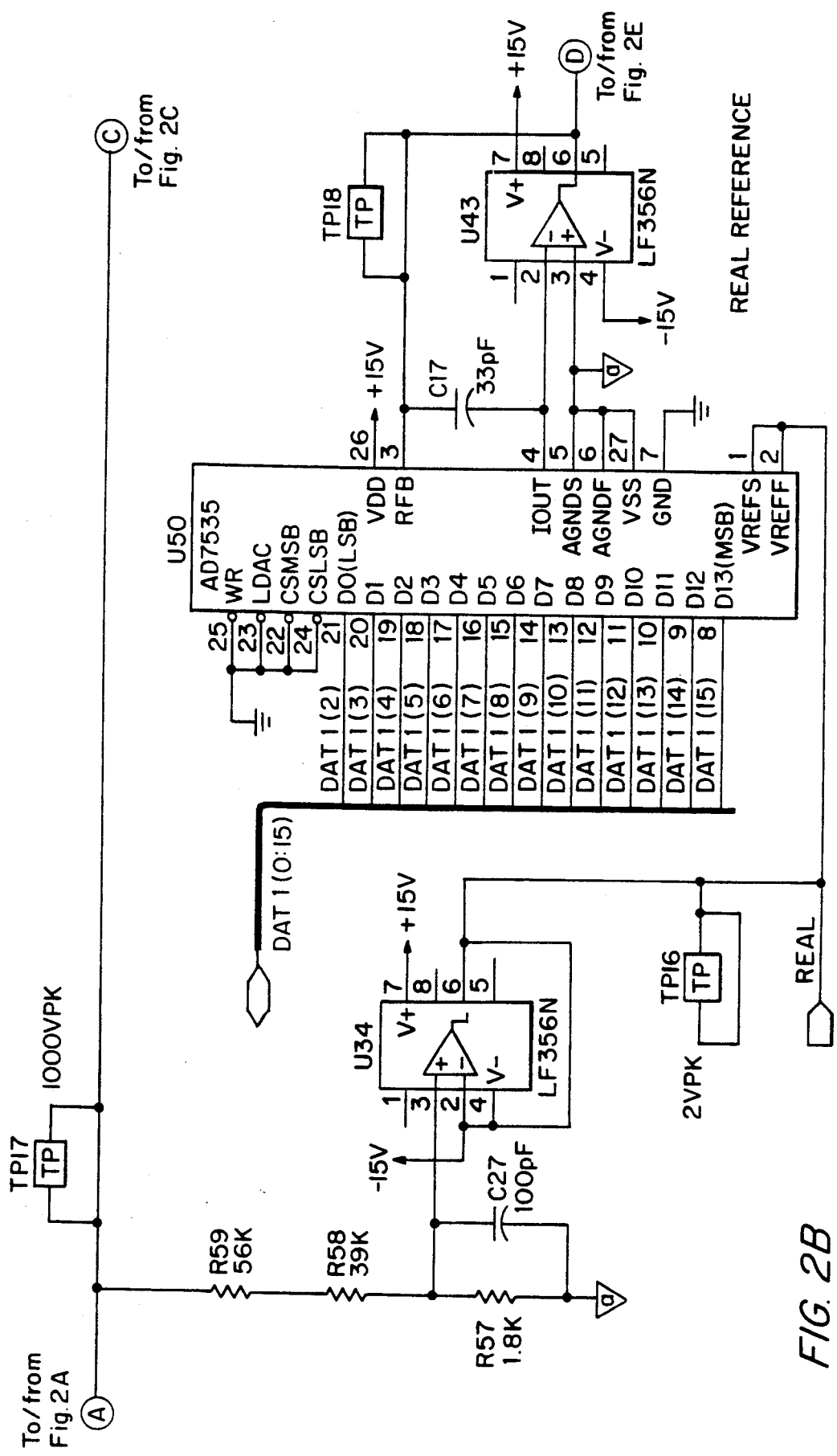
Figure 2C:
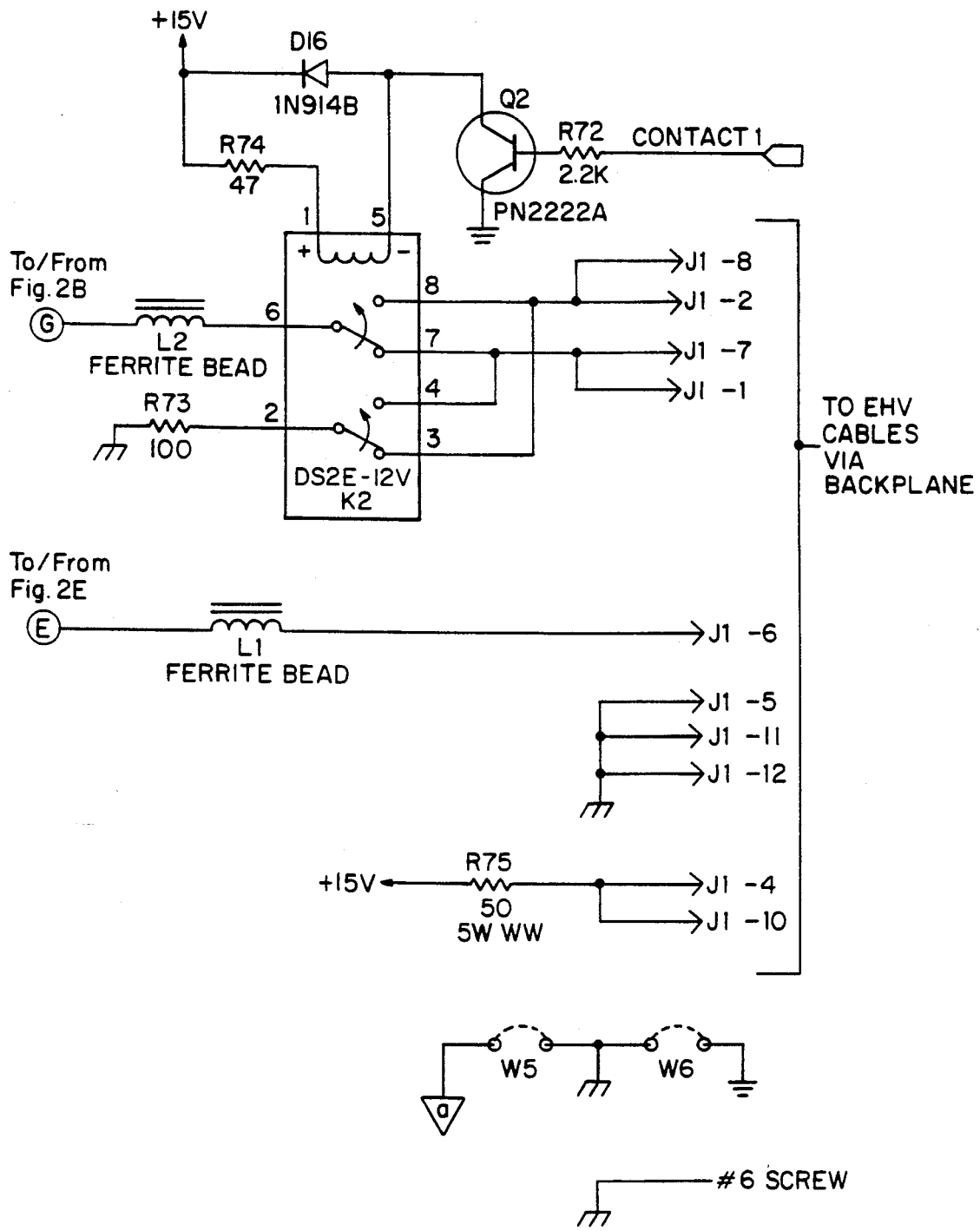
Figure 2D:
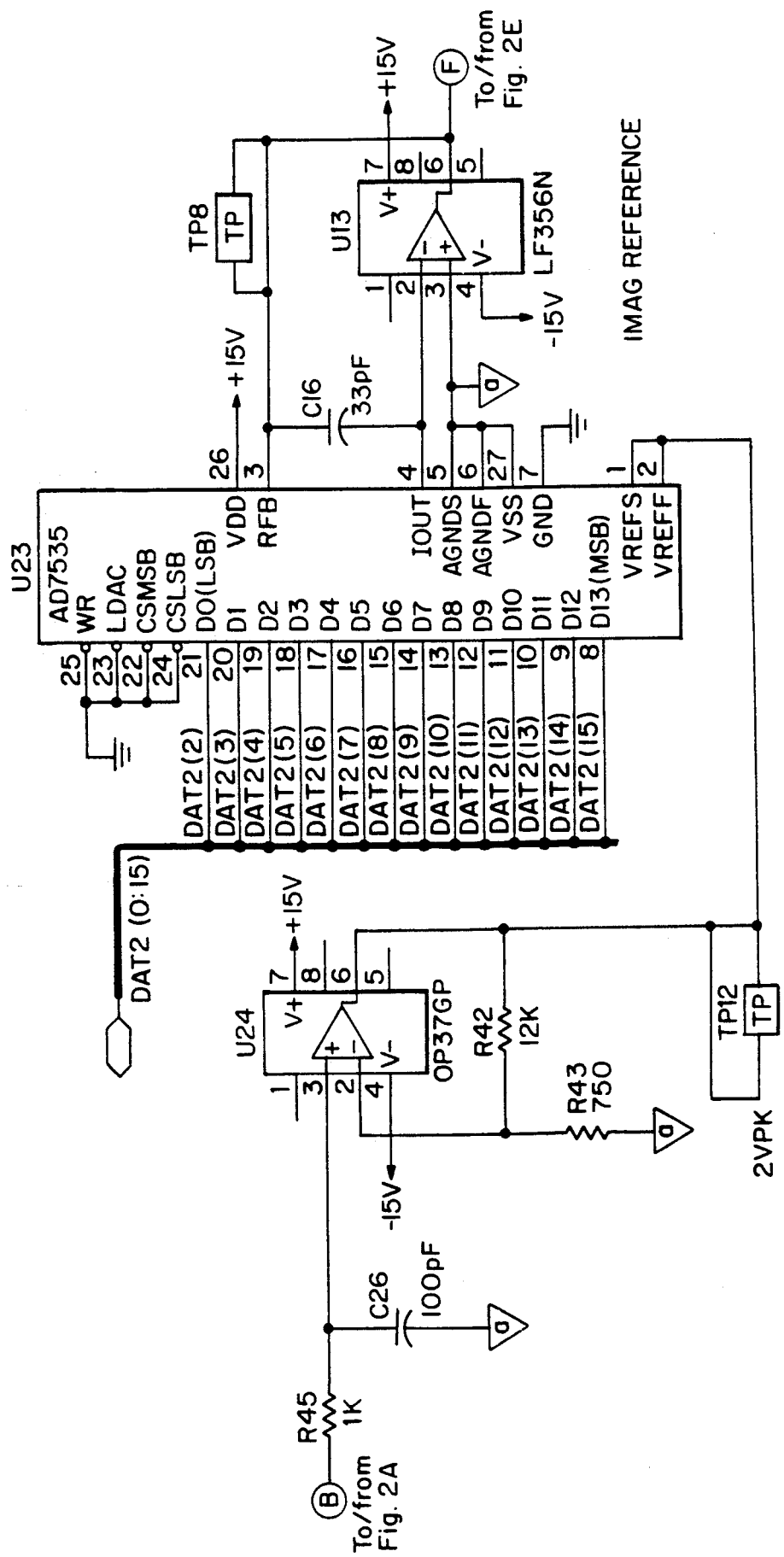
Figure 2E:
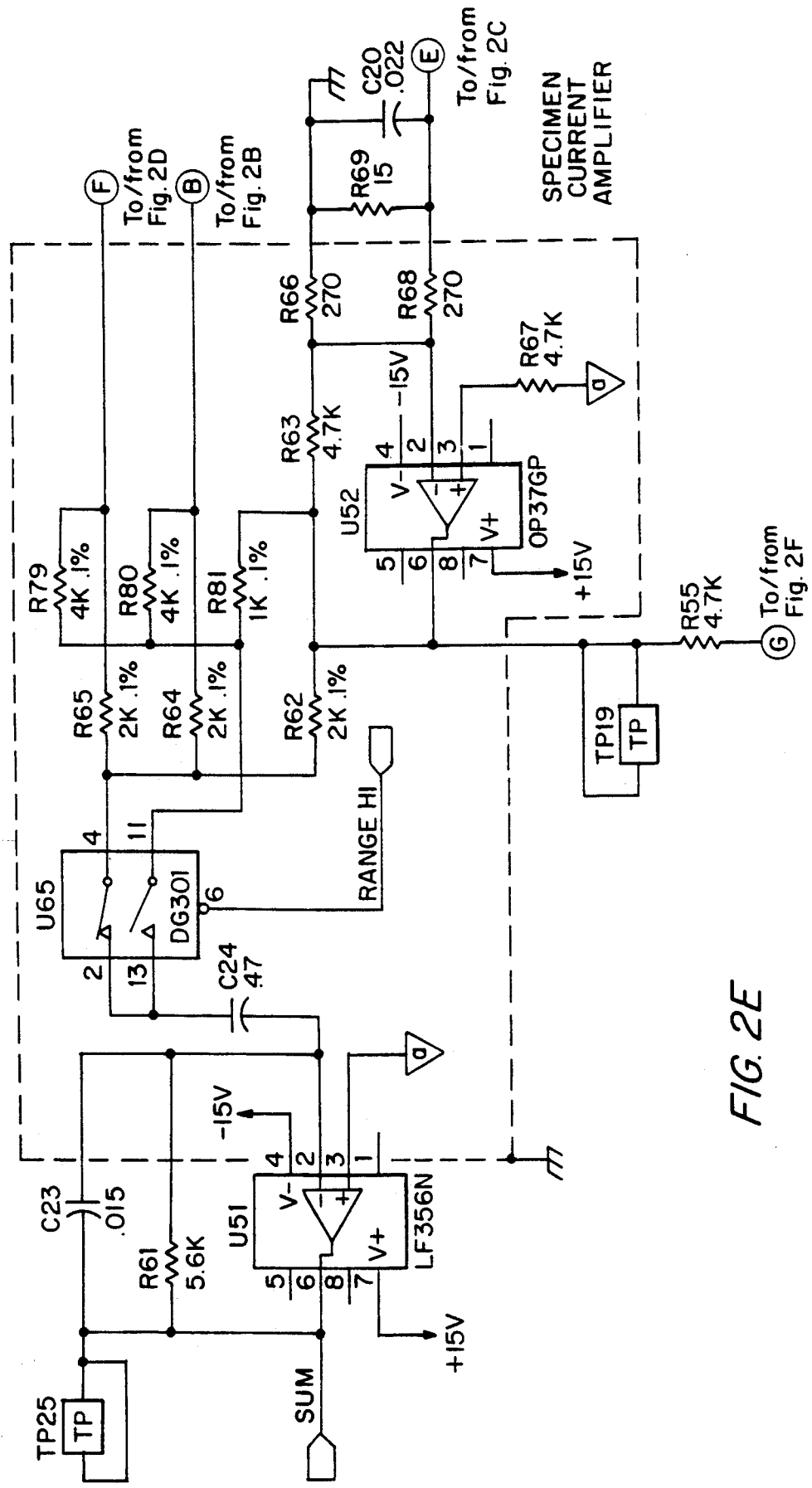
Figure 2F:
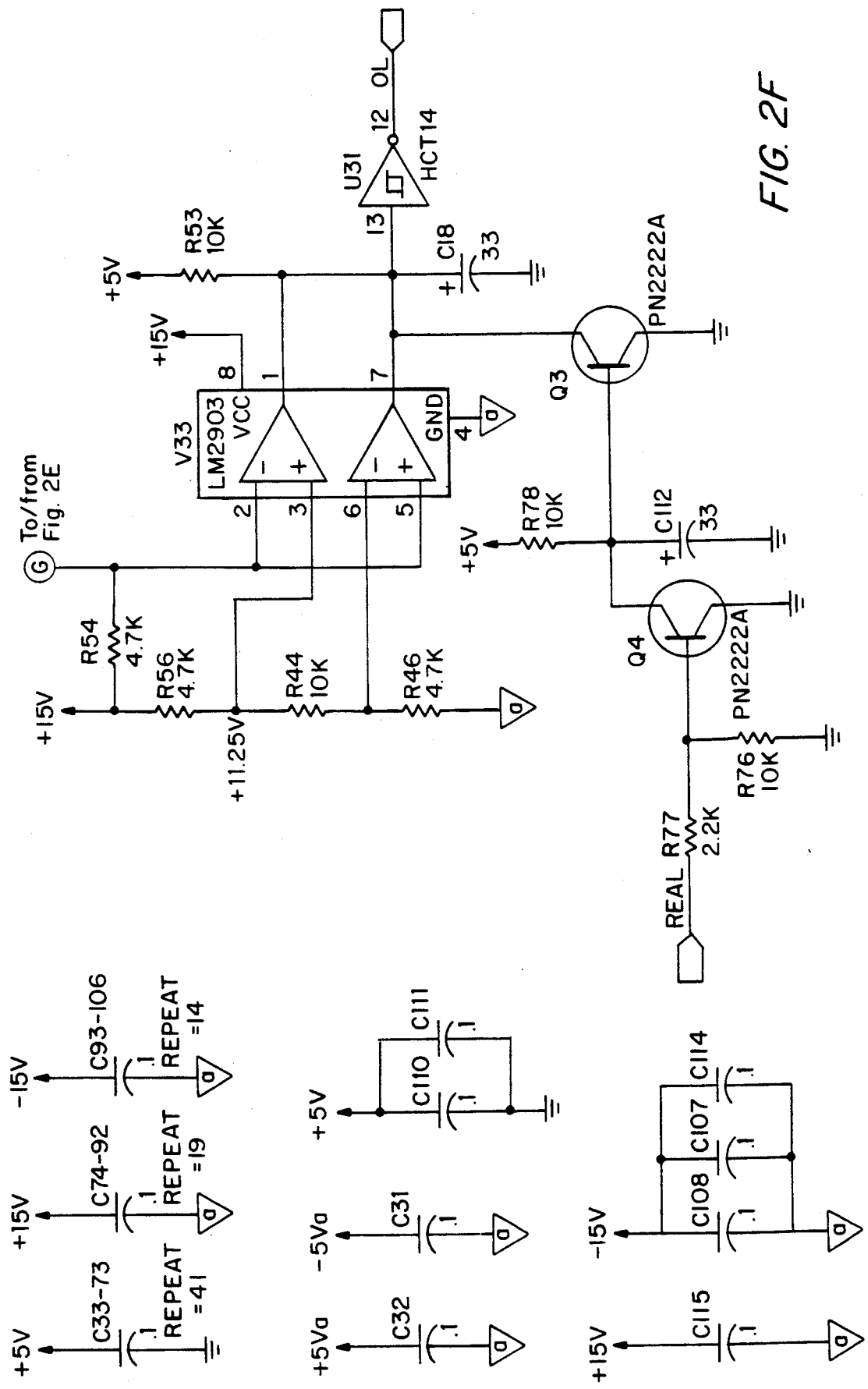
Figure 3A:
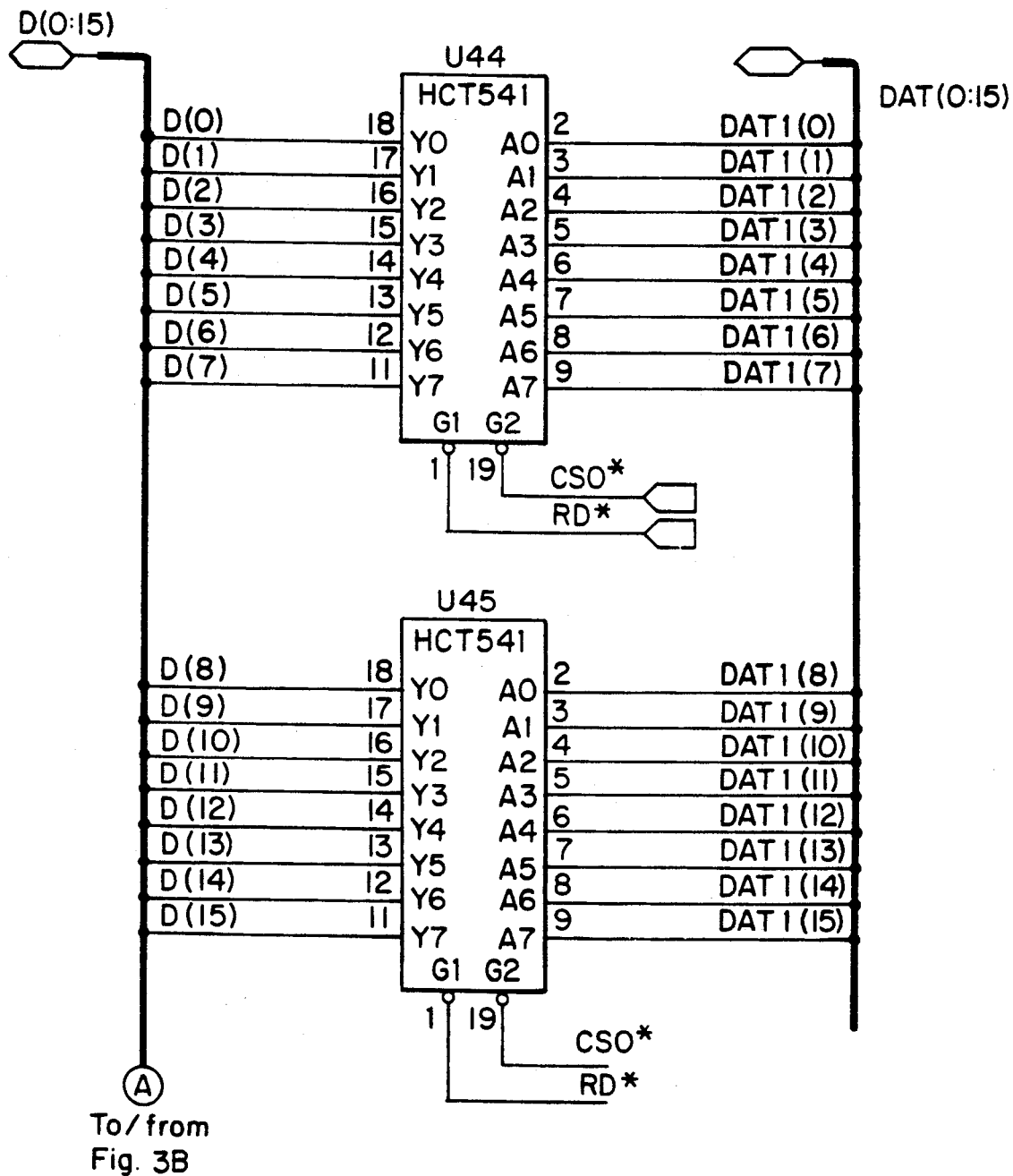
Figure 3B:
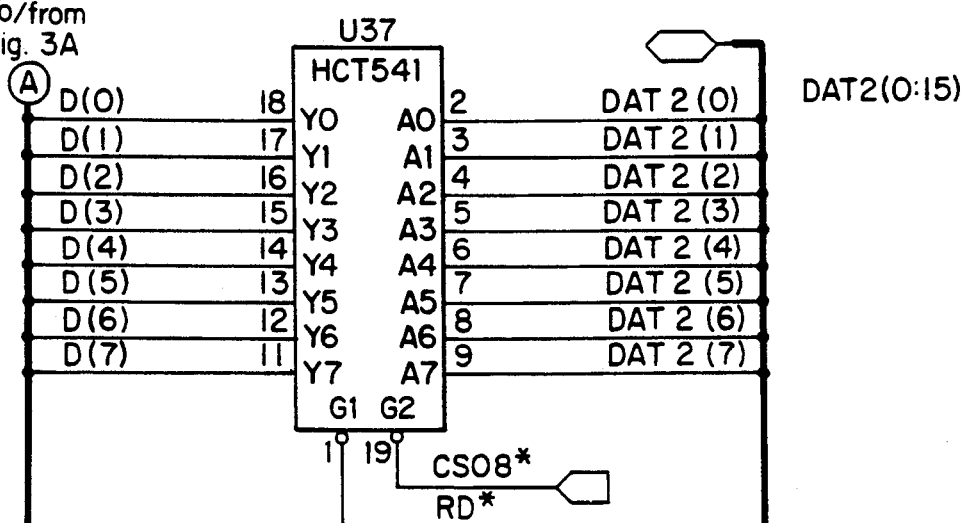
Figure 3B:
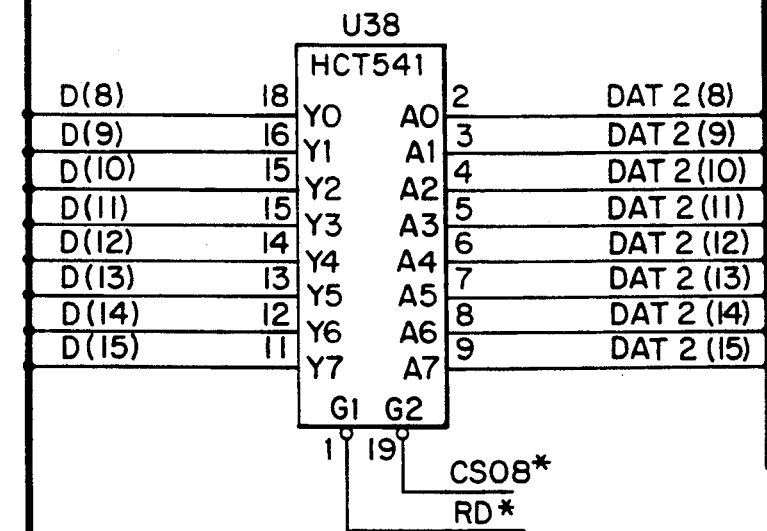
Figure 3B:
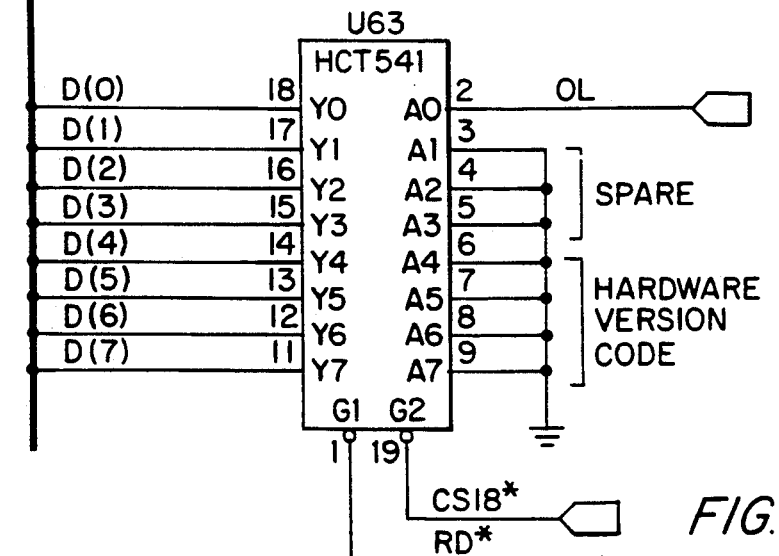
Figure 3C:
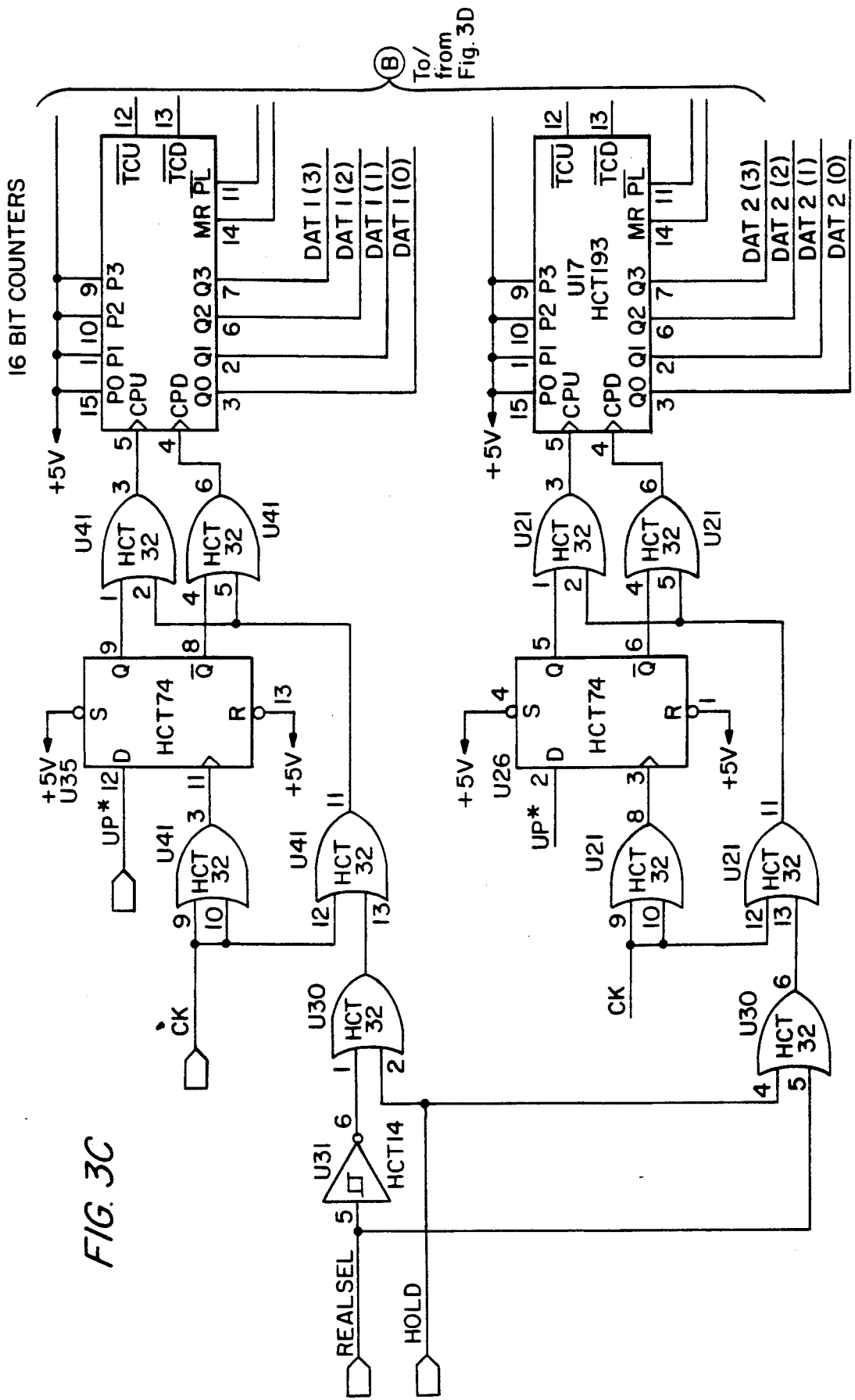
Figure 3D:
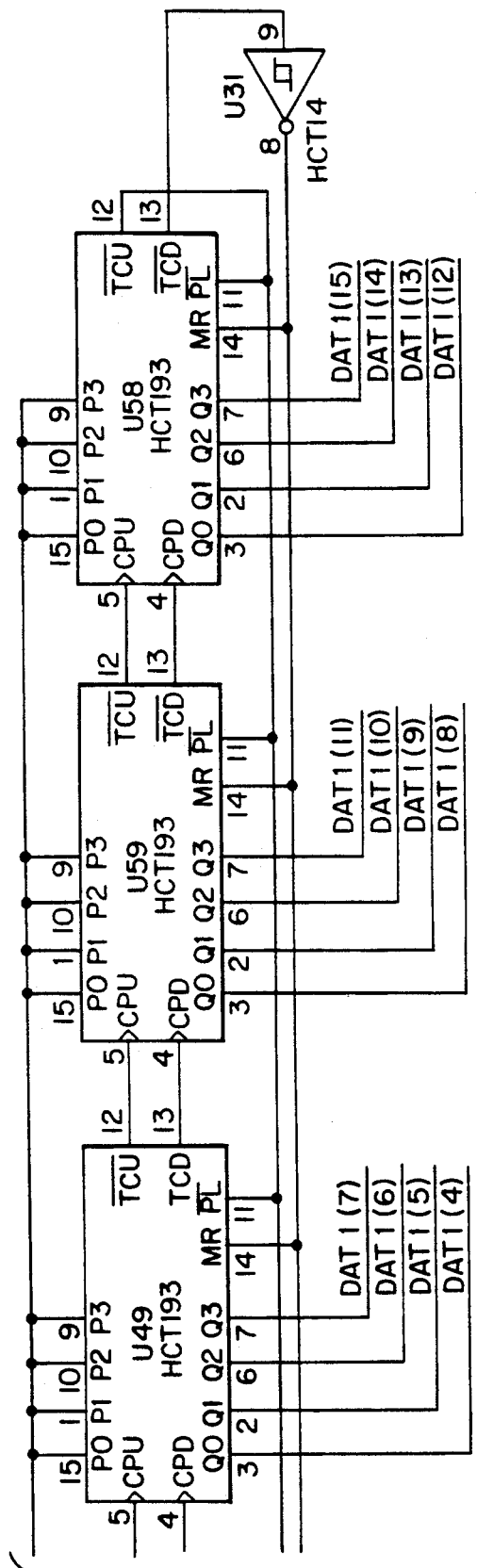
Figure 3D:
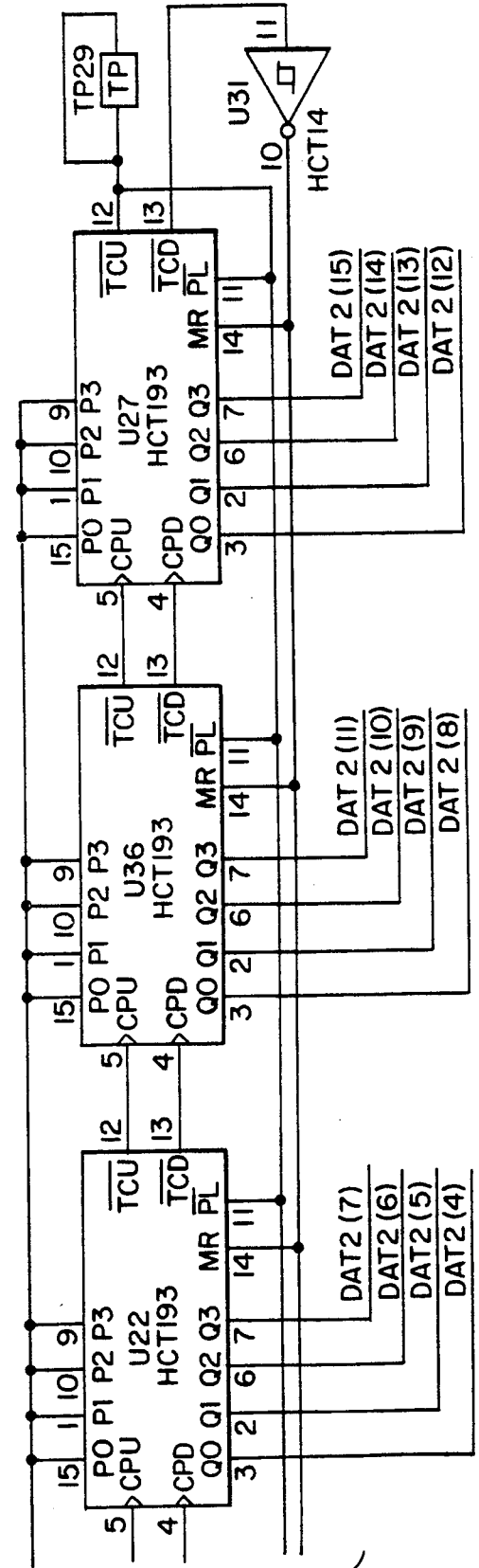
Figure 3E:
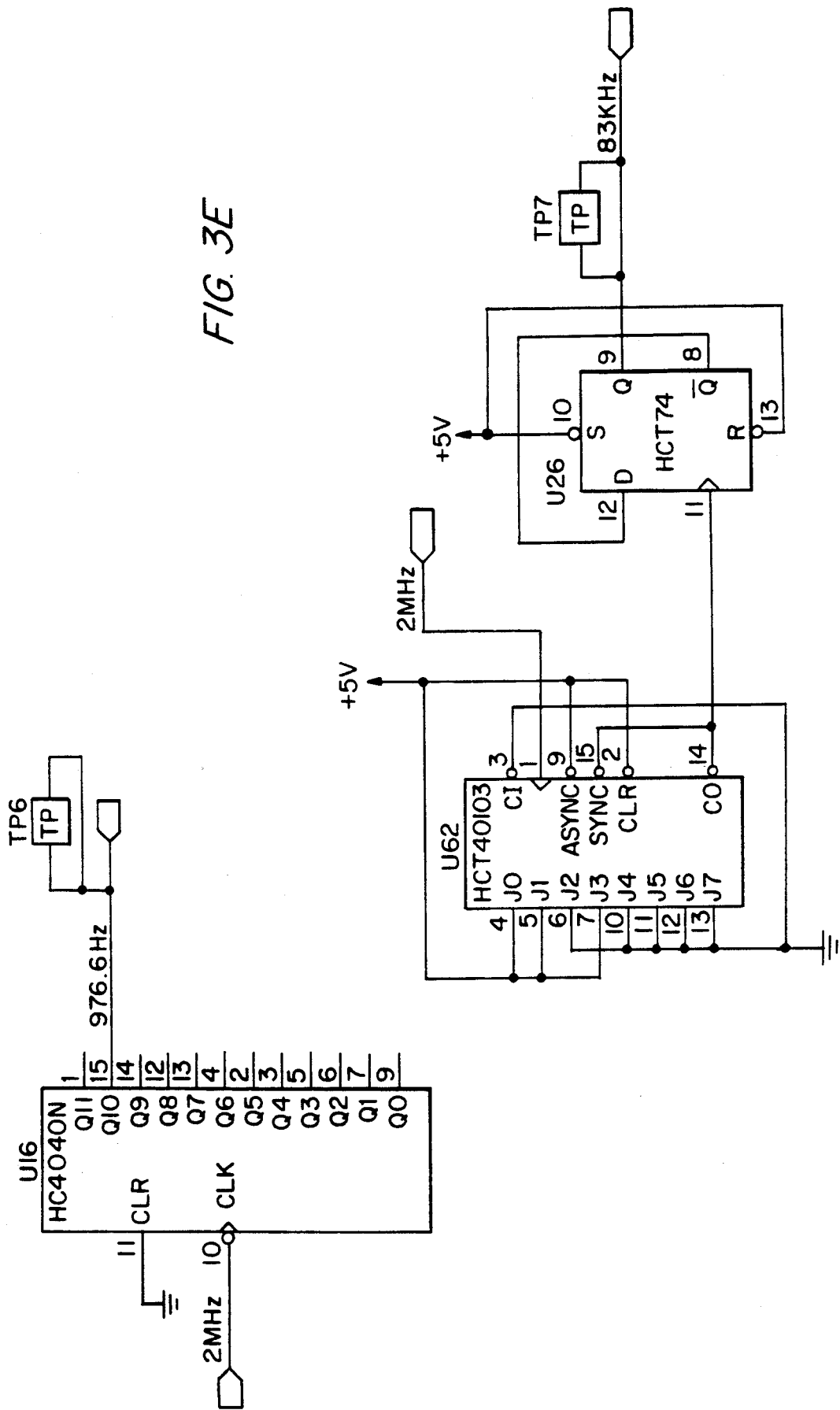
Figure 4A:
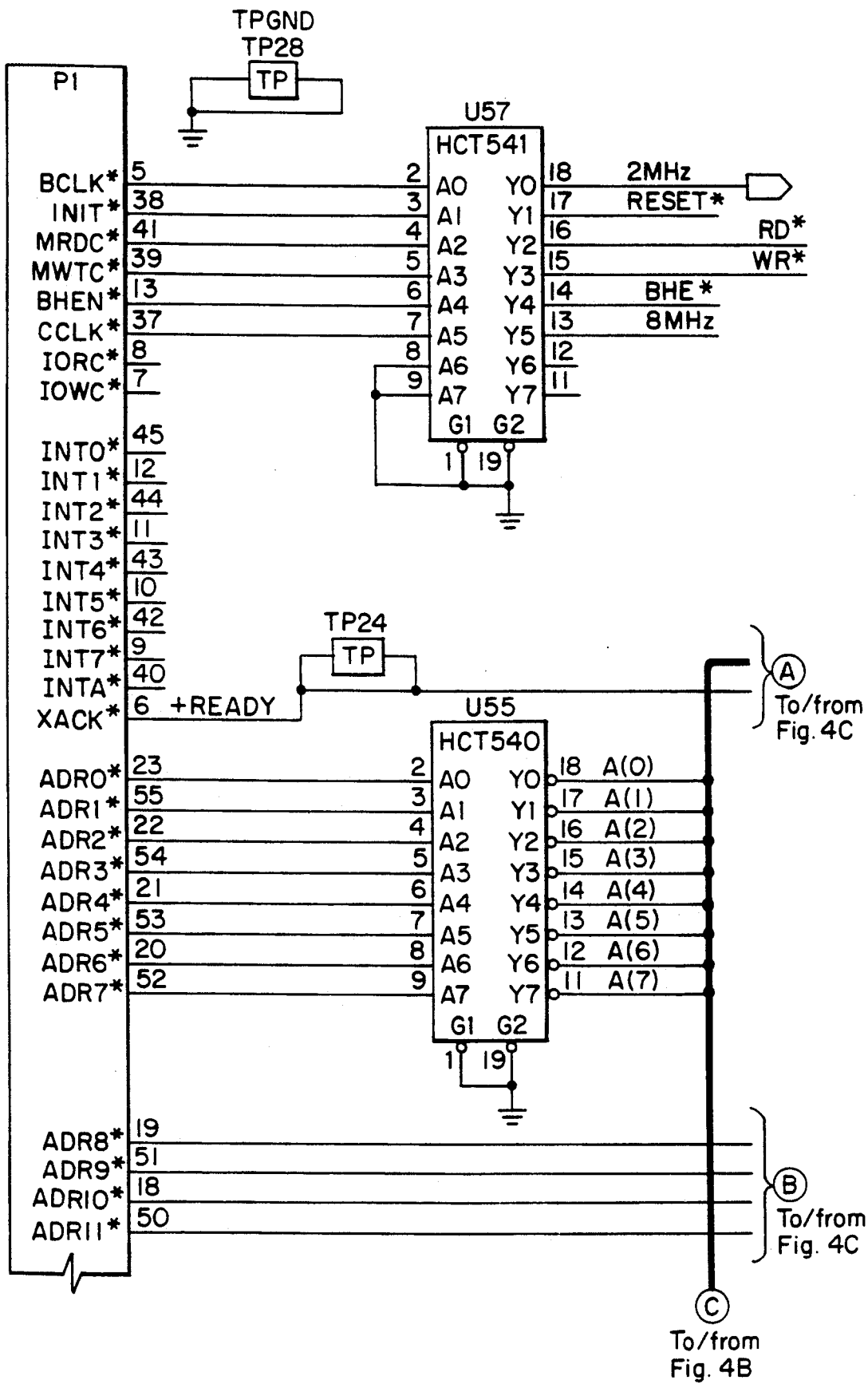
Figure 4B:
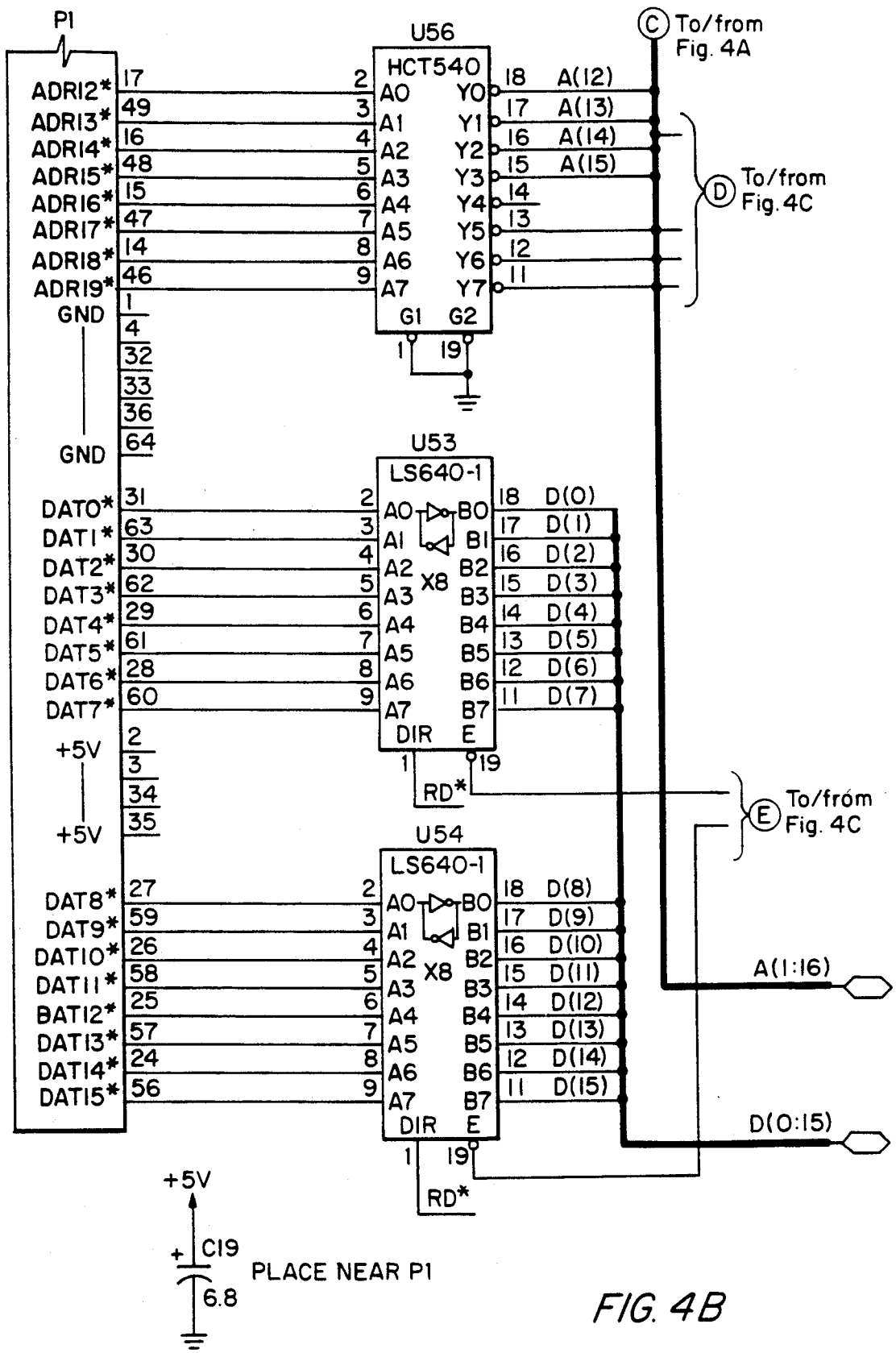
Figure 4C:
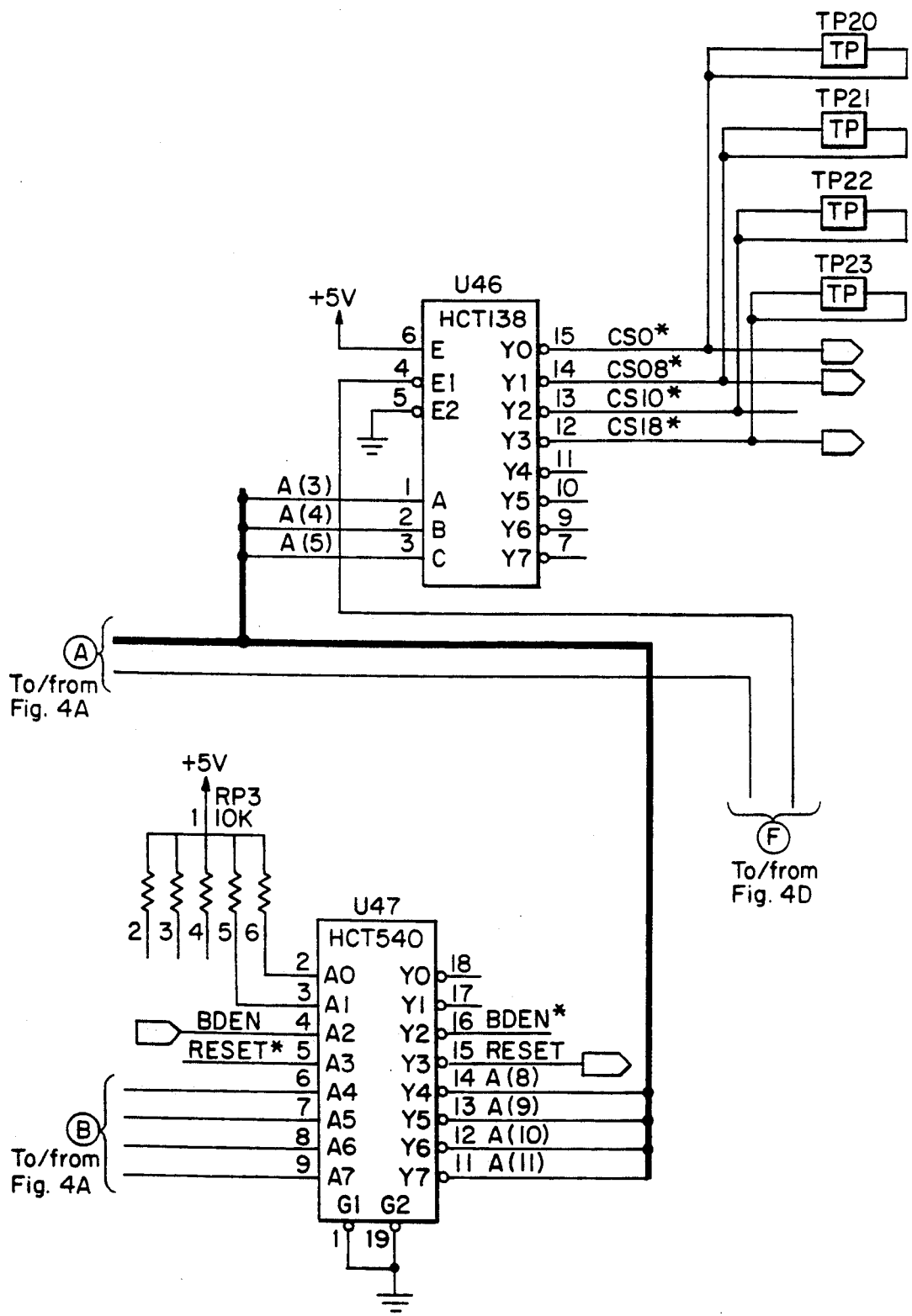
Figure 4D:
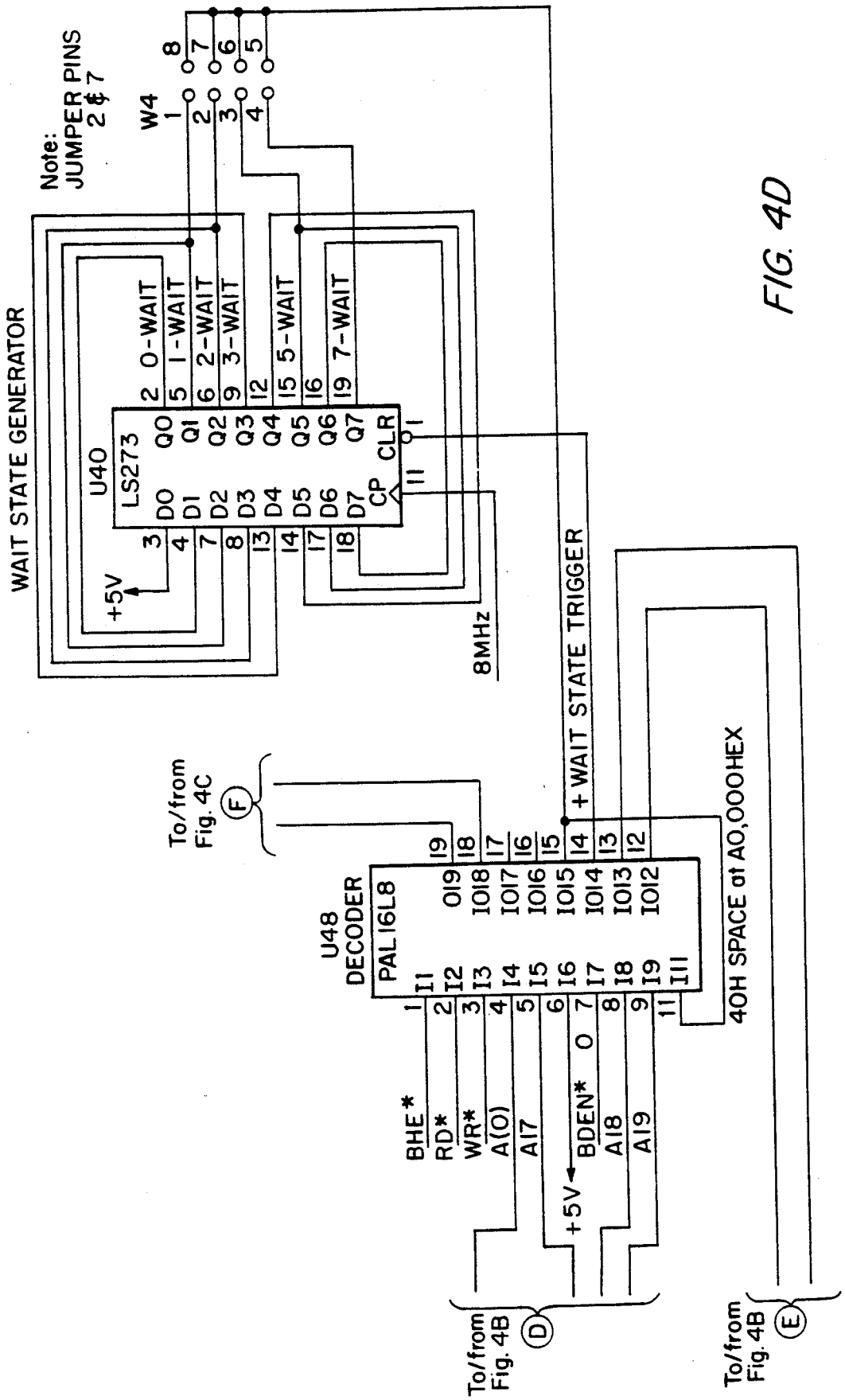
Figure 4E:
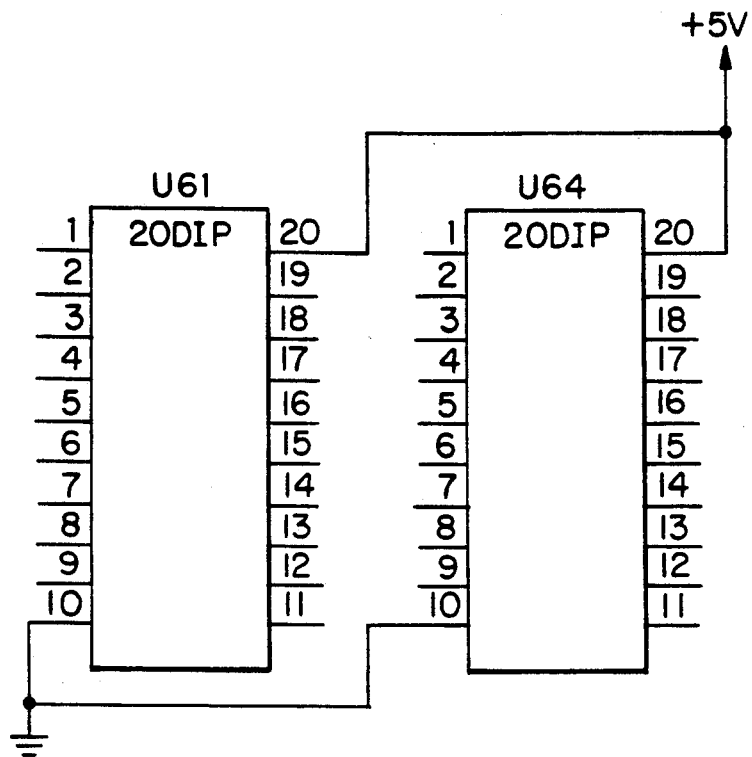
Figure 4E:
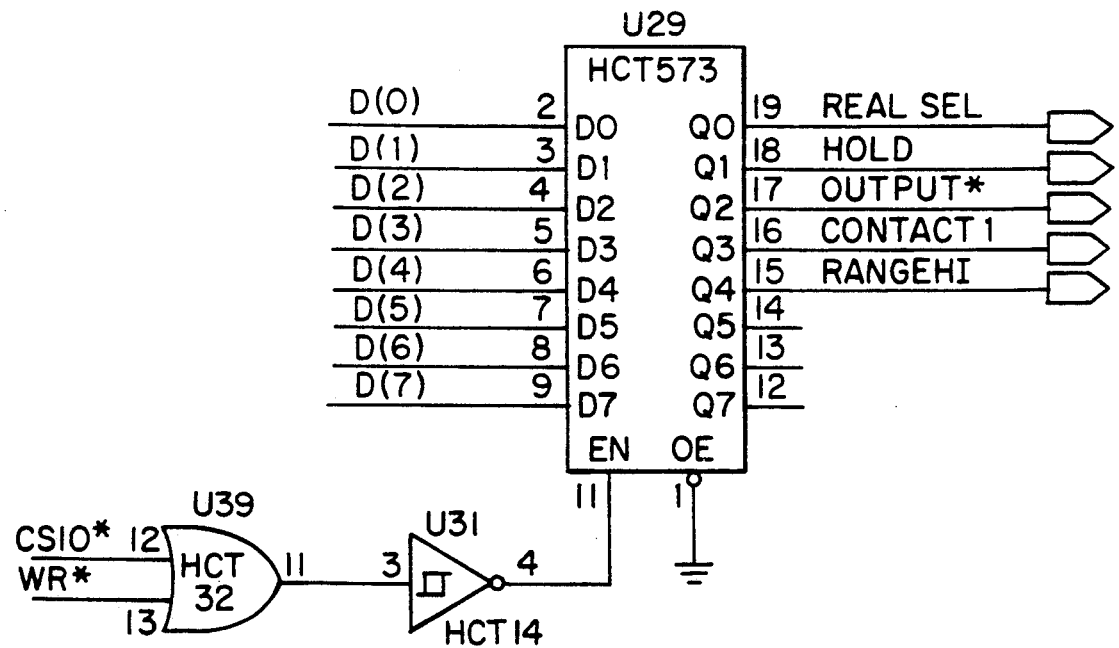
Figure 5A:
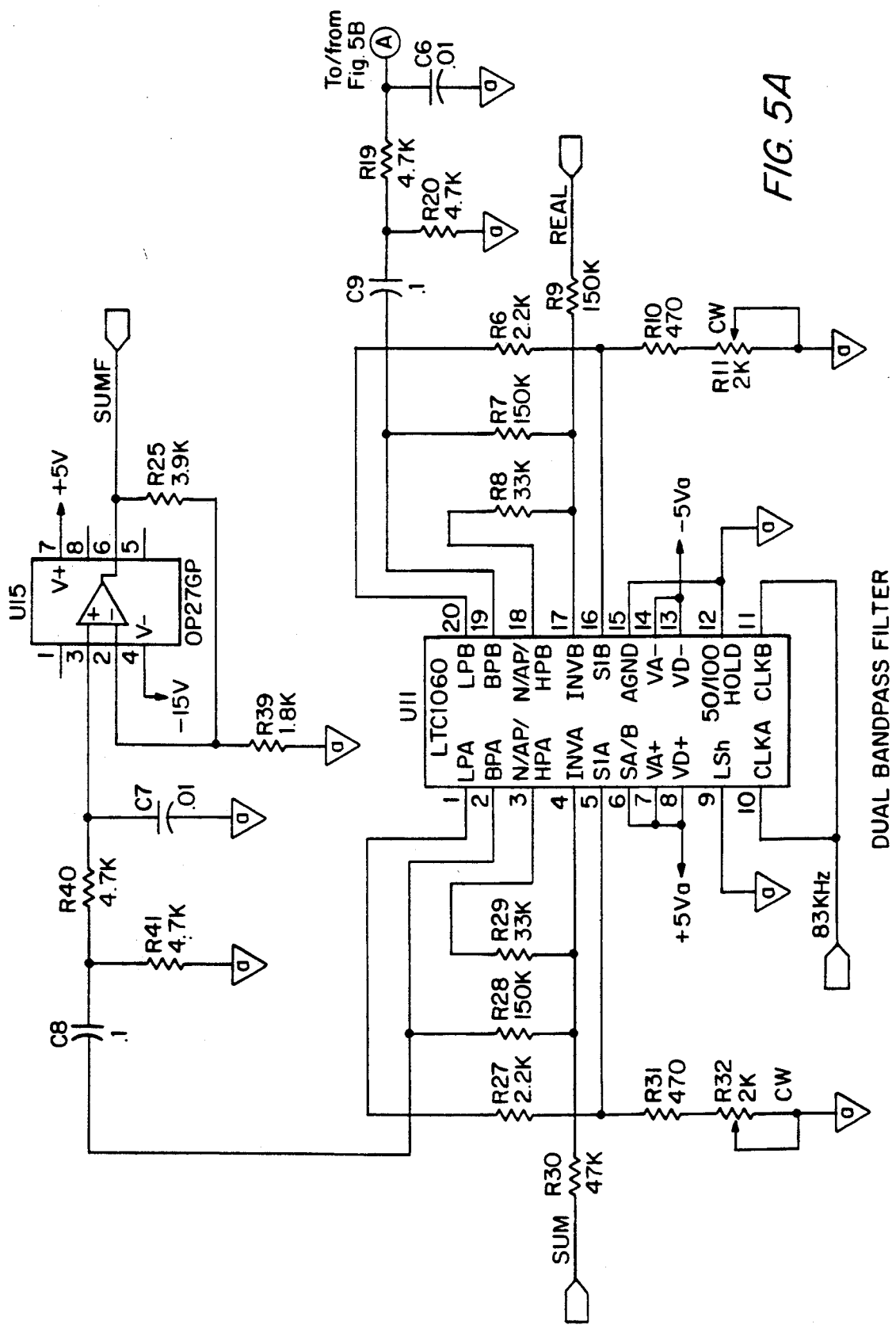
Figure 5B:
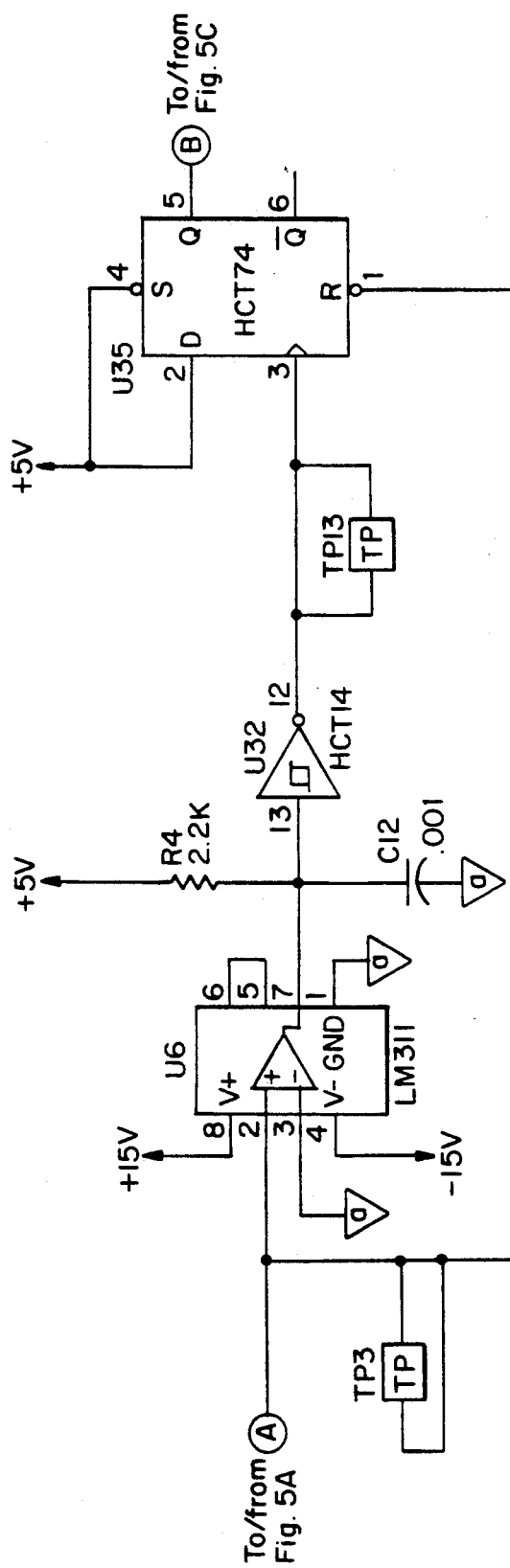
Figure 5B:
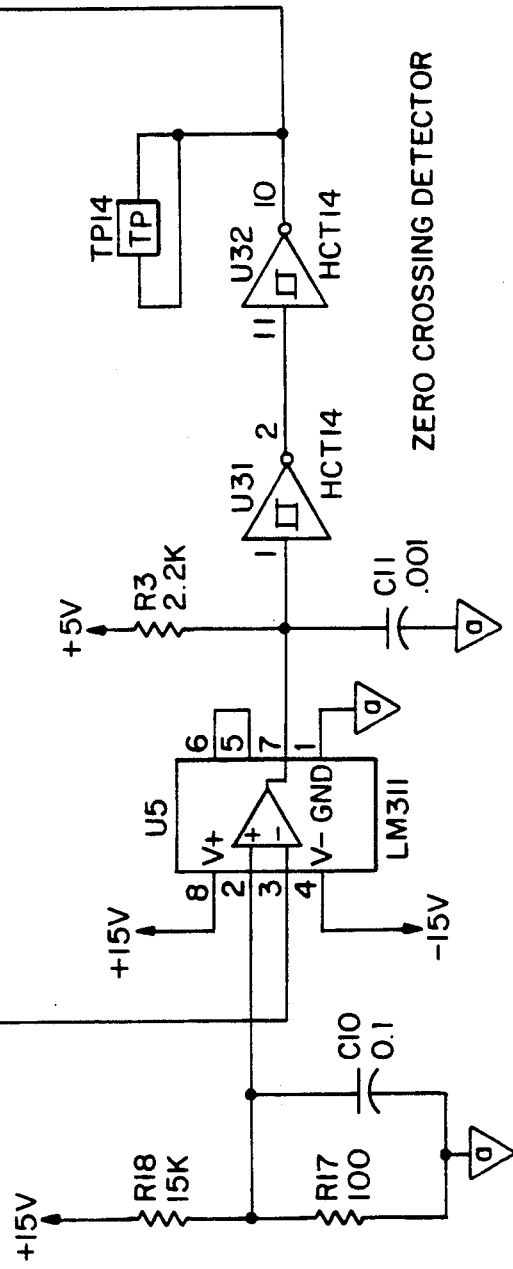
Figure 5C:
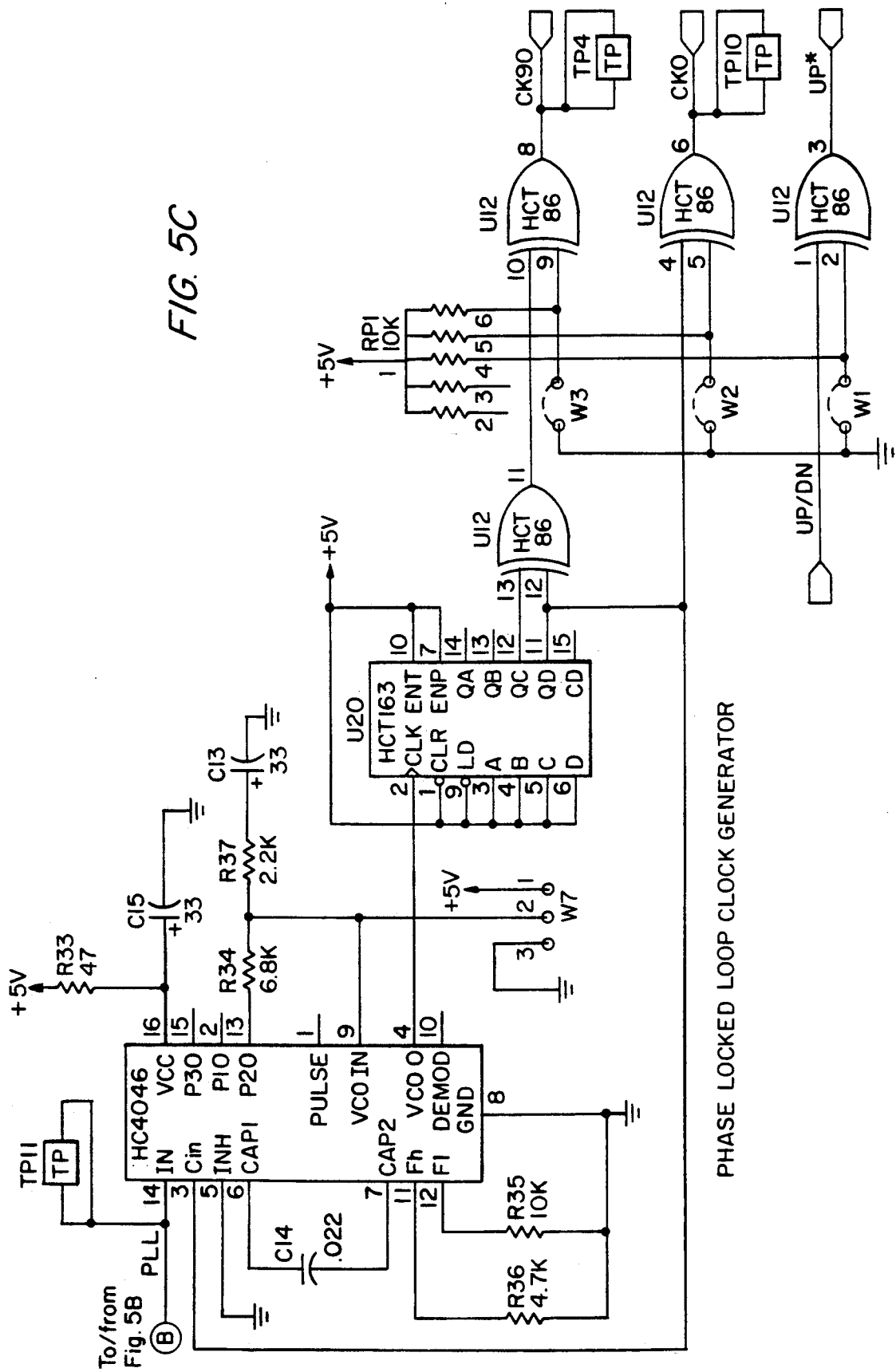
Figure 6A:
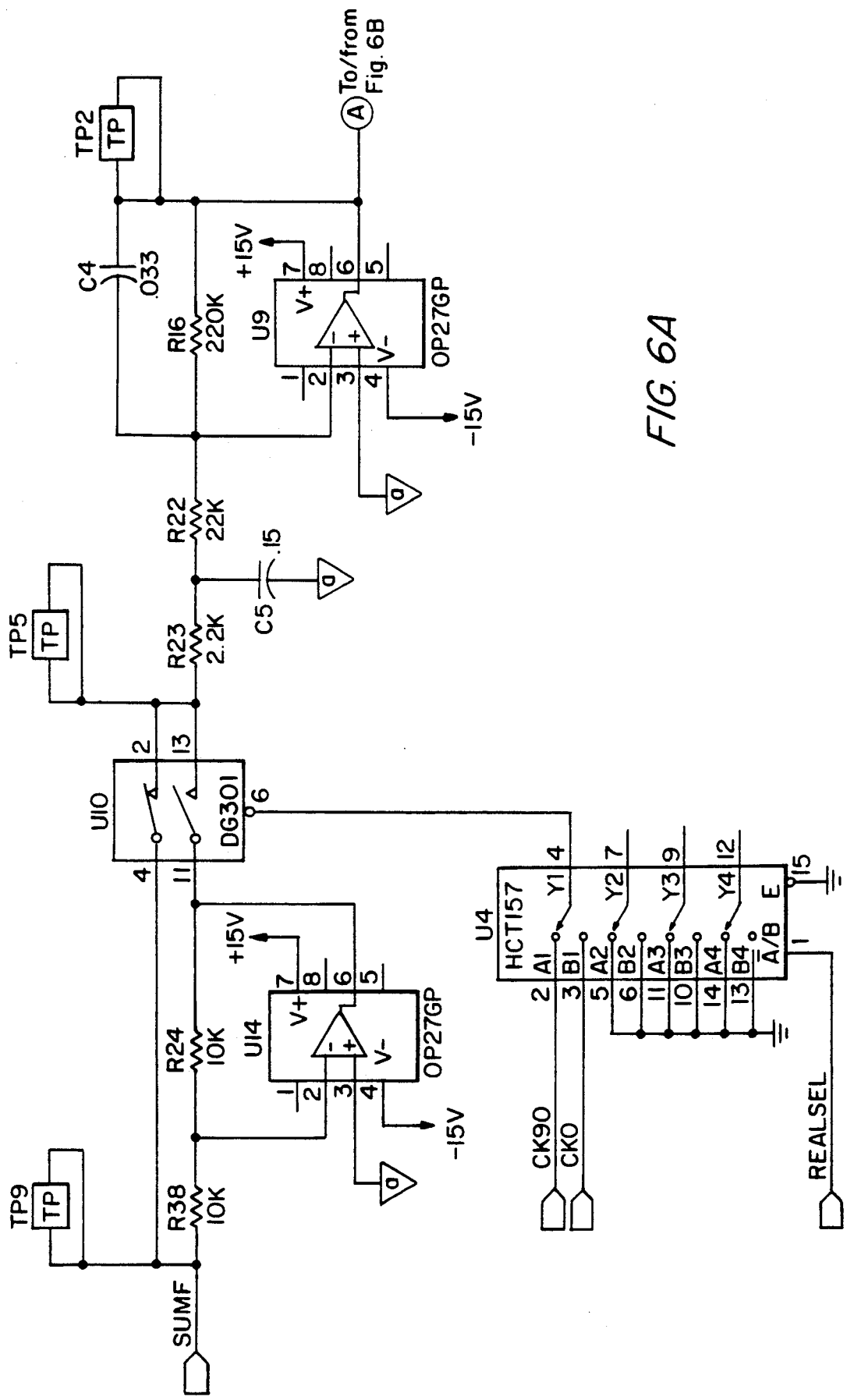
Figure 6B:
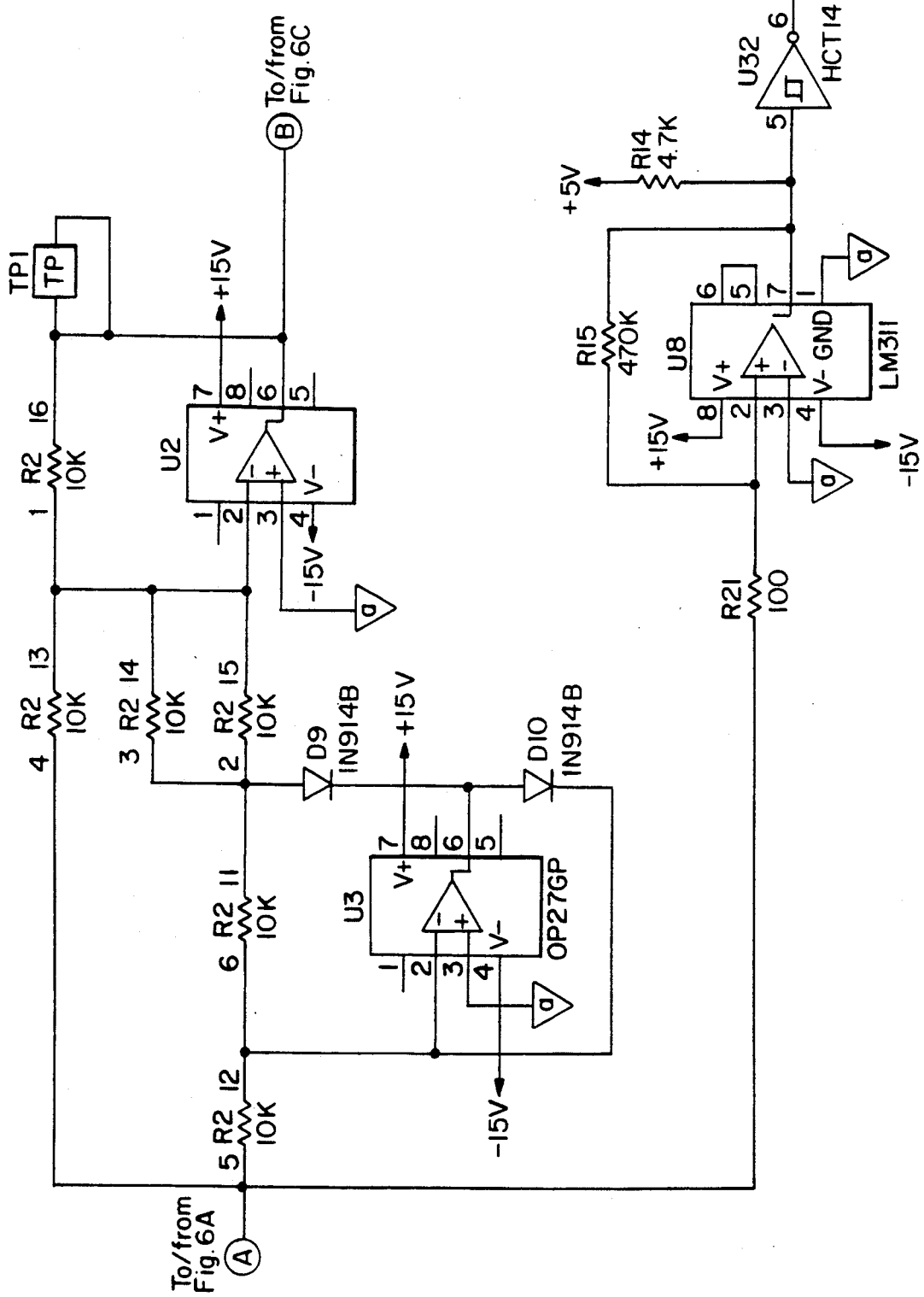
Figure 6C:
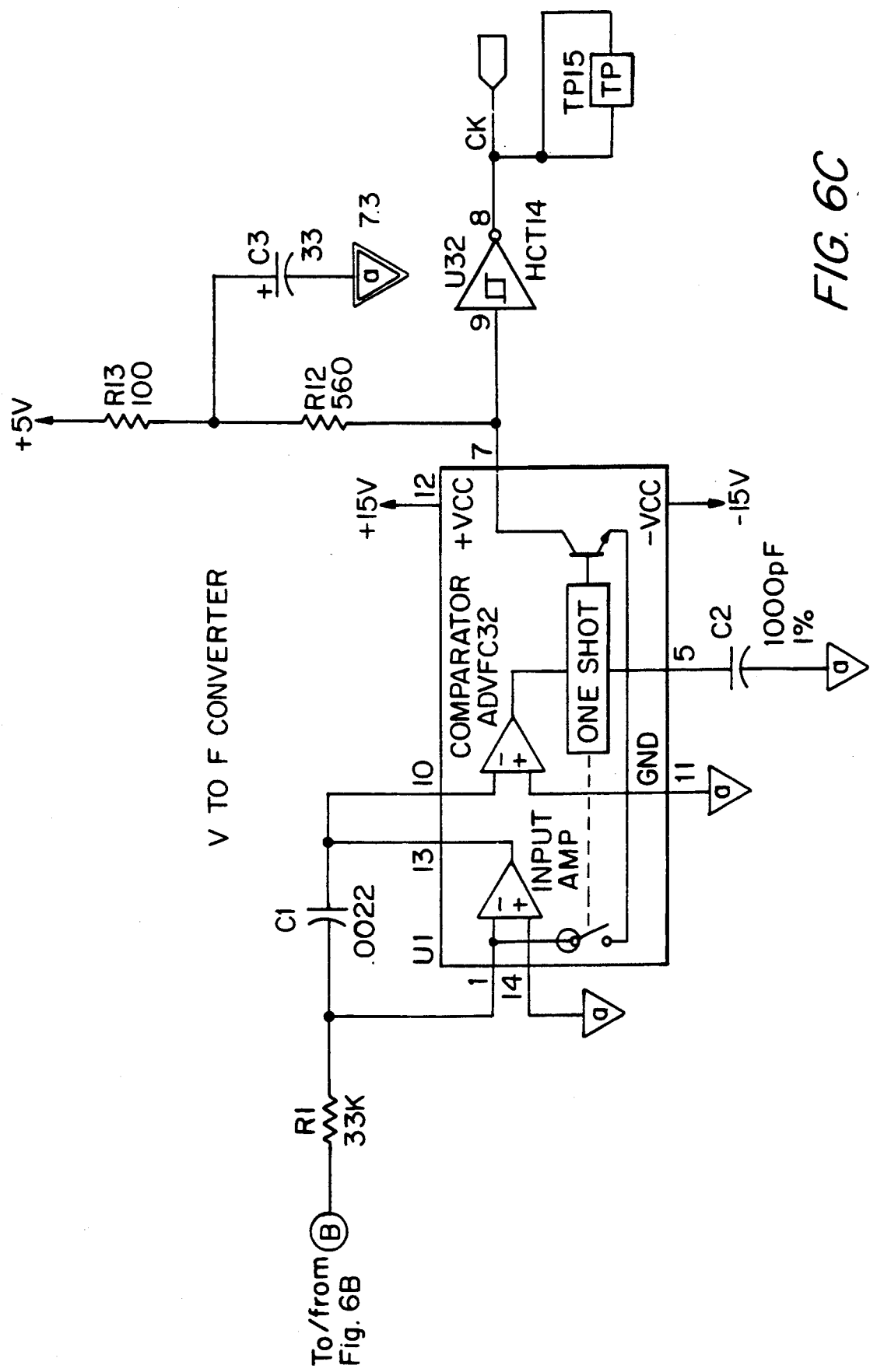
Figure 6D:
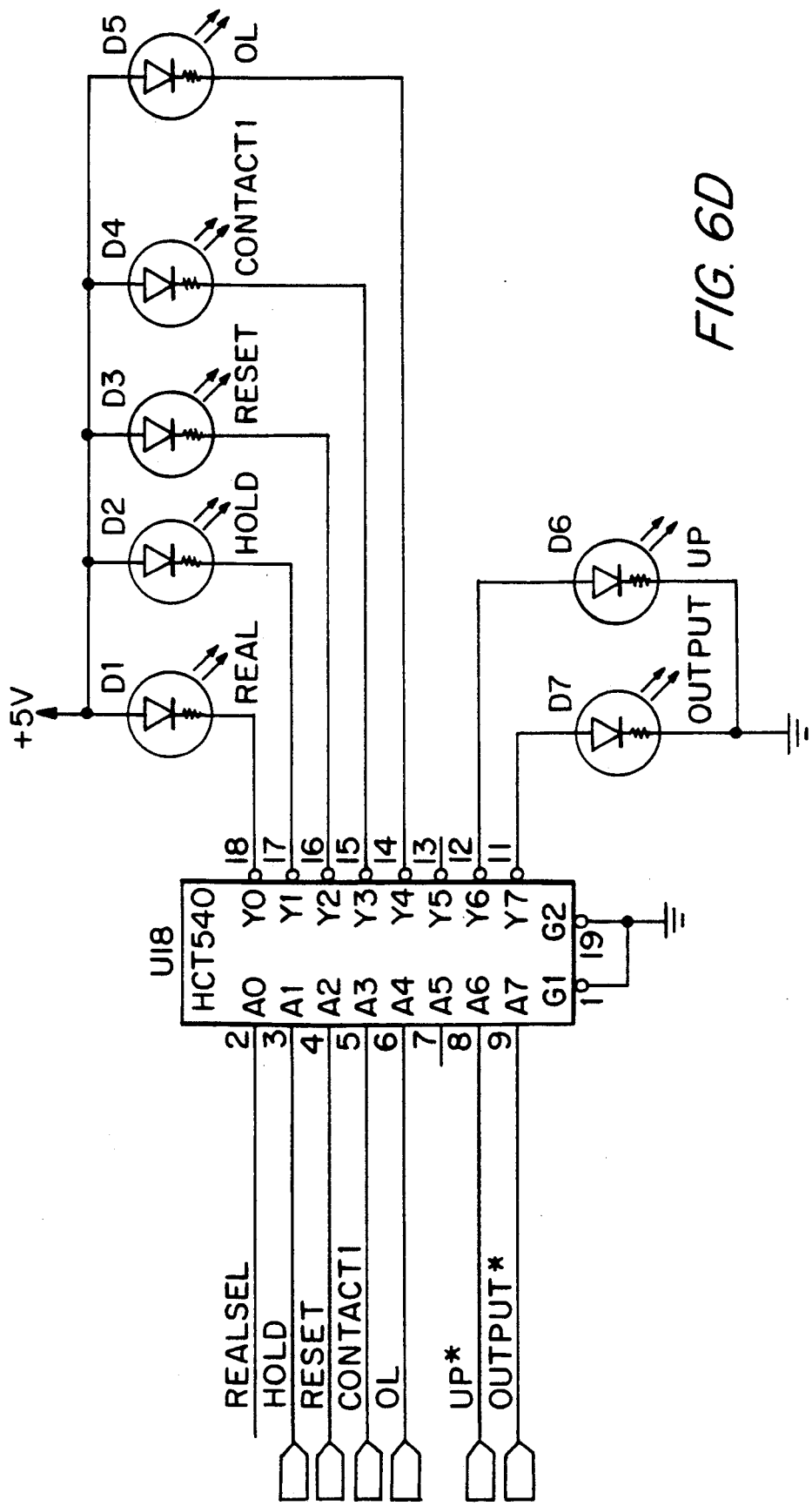
Figure 7A:
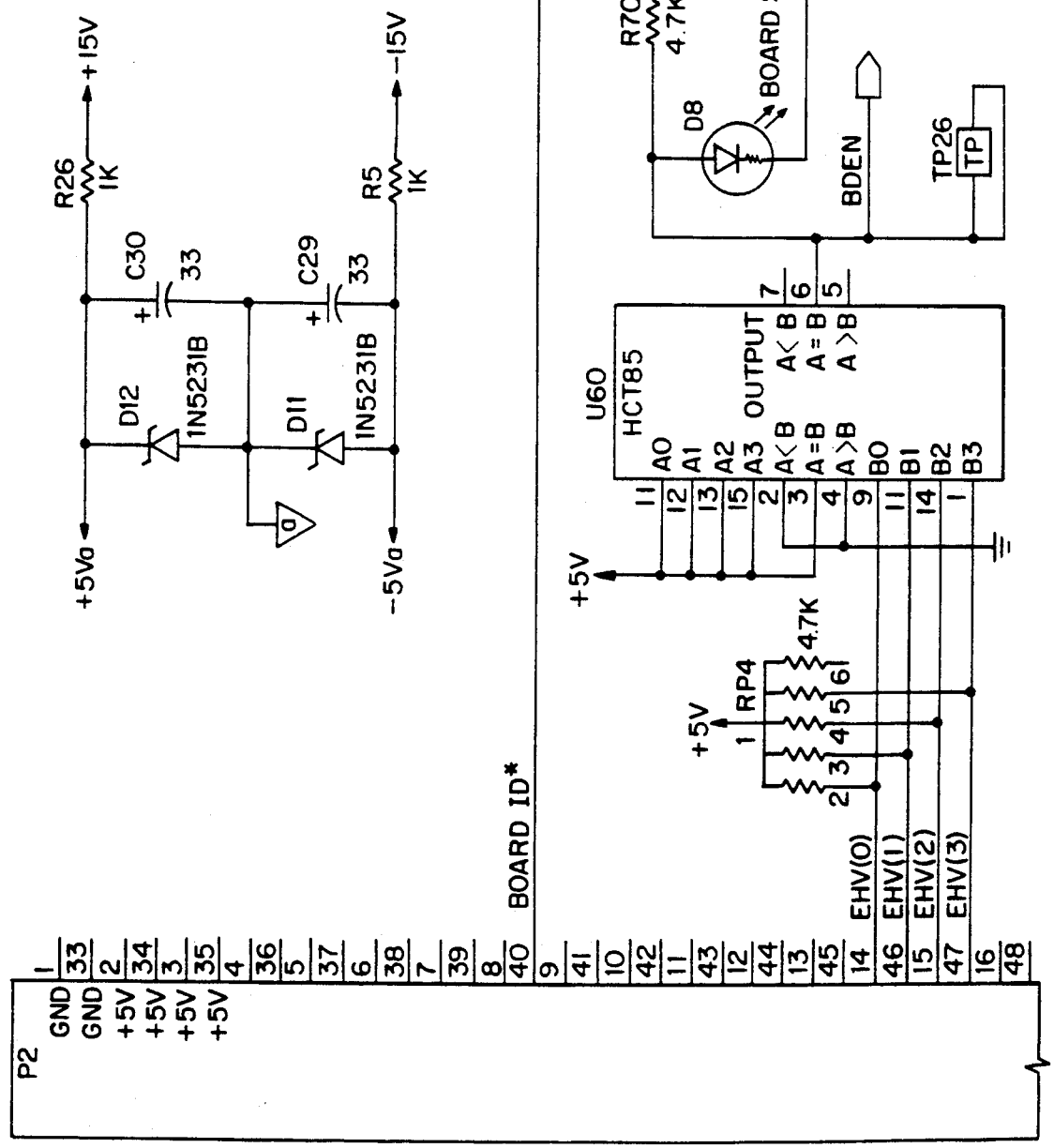
Figure 7B:
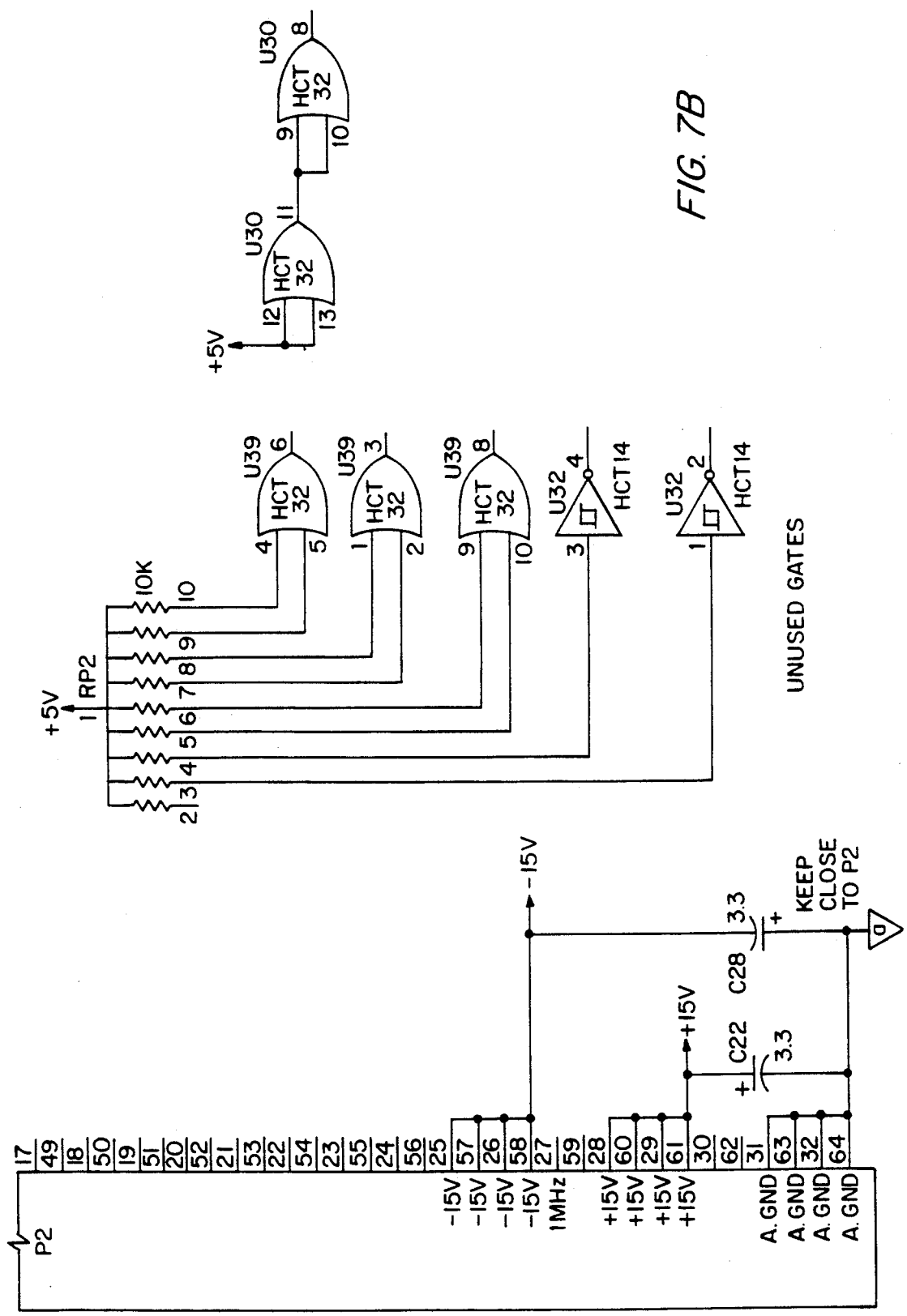

United States Patent [19]
Allfather

[11] Patent Number: 5,287,065
[45] Date of Patent: Feb. 15, 1994

[54] AUTOMATIC BRIDGE BALANCING USING CONTROLLABLE IMPEDANCE IN CHARACTERIZING UNKNOWN IMPEDANCE

[75] Inventor: Lars P. Allfather, Boston, Mass.

[73] Assignee: Doble Engineering Company, Watertown, Mass.

[21] Appl. No.: 771,770

[22] Filed: Oct. 4, 1991

[51] Int. Cl.$^5$ ............................................. G01R 27/02
[52] U.S. Cl. ...................................... 324/651; 324/680; 324/706; 324/725
[58] Field of Search ............... 324/650, 651, 673, 680, 324/706, 725

[56] References Cited

U.S. PATENT DOCUMENTS

| | | | |
|---|---|---|---|
| 3,562,641 | 2/1971 | Fulks | 324/680 |
| 3,766,469 | 10/1973 | Nakane | 324/650 |
| 4,772,844 | 9/1988 | Andeen et al. | 324/651 |
| 4,841,228 | 6/1989 | Noguchi et al. | 324/650 X |
| 5,113,140 | 5/1992 | So | 324/680 |
| 5,189,362 | 2/1993 | Doble | 324/706 X |

Primary Examiner—Kenneth A. Wieder
Assistant Examiner—Glenn W. Brown
Attorney, Agent, or Firm—Fish & Richardson

[57] ABSTRACT

Automatic bridge balancing apparatus includes a reference impedance and a measuring terminal pair for receiving an unknown impedance. A source of a test signal is coupled to the reference impedance and the measuring terminal pair. A measuring detector is connected in series with the unknown impedance when connected to the measuring terminal pair to provide a measured signal. A reference detector is coupled to the reference impedance to provide a reference signal. A combiner combines the measured signal with the reference signal to provide an error signal. The reference detector includes an up/down counter coupled to a digital attenuator that provides the reference signal. A controller responds to the error signal to control the count in the up/down counter so that the associated digital attenuator provides a signal to the combiner that reduces the error signal so that the count in the up/down counter is characteristic of the unknown impedance.

17 Claims, 26 Drawing Sheets

AUTOMATIC BRIDGE BALANCING USING CONTROLLABLE IMPEDANCE IN CHARACTERIZING UNKNOWN IMPEDANCE

The present invention relates in general to automatic bridge balancing and more particularly concerns novel apparatus and techniques advantageously using both digital and analog techniques for providing an indication of imaginary and real components of an unknown impedance.

One approach toward automatic bridge balancing uses a technique having a capacitance balancing potentiometer for balancing the imaginary component of the unknown impedance and a polarity checking potentiometer for balancing the real component of the unknown impedance.

According to the invention there is a reference impedance, typically comprising a reference resistance in parallel with a reference capacitance and a measuring terminal pair for receiving an unknown impedance, typically representable as an unknown resistance in parallel with an unknown capacitance. There is a source of a test signal, typically of known frequency and voltage, coupled to the reference impedance and the measuring terminal pair for energizing the known and unknown impedances in parallel. A measuring detector is connected in series with the unknown impedance when connected to said measuring terminal pair to provide a measured signal representative of the current flowing through the unknown impedance. There are reference imaginary and reference real detectors connected in series with the imaginary and real components respectively of the known impedance for providing reference imaginary and reference real signals, respectively, characteristic of the current flowing in the imaginary and real components, respectively, of the known impedance. A combiner combines the measured signal with the reference imaginary and reference real current signals to provide imaginary and real error signals, respectively, representative of the difference between the imaginary components of the measured and reference imaginary signals and the difference between the real components of the measured and reference real signals. The reference imaginary and reference real detectors include imaginary and real up/down counters, respectively, coupled to imaginary and real digital attenuators, respectively, that are coupled to reference imaginary and reference real inputs, respectively, of the combiner. A controller responds to the imaginary and real error signals to control the count in the imaginary and real counters, respectively, so that the associated digital attenuators provide signals to the reference imaginary and reference real inputs of the combiner that minimize the imaginary error and real error signals, respectively, so that the count in the imaginary counter and in the real counter is then characteristic of the imaginary and real components, respectively, of the unknown impedance and the power factor thereof.

Preferably the test signal is at a frequency significantly above and unharmonically related to the power frequency. Preferably the output of the combiner energizes a bandpass filter centered at the frequency of the test signal, typically 1 kHz to provide a filtered error signal at that frequency that helps control a clock pulse source, such as a voltage controlled oscillator, that advances or retards the count in a respective imaginary and real counter so as to minimize the error signal.

Switching circuitry preferably directs clock signals to the respective counters during mutually exclusive time intervals.

Preferably, the signal on the reference real input is set to zero, and the imaginary error signal minimized. Then with the signal on the reference imaginary input fixed, the signal on the reference real input is adjusted to minimize the real error component. Preferably these adjustments are iterated a number of times, typically four, for optimum performance because of slight interaction between adjustments caused by the imprecise nature of sensing the error signals.

Other features, objects and advantages of the invention will become apparent from the following detailed description and from the claims when read in connection with the accompanying drawings in which:

FIG. 1 is a block diagram illustrating the logical arrangement of a system according to the invention; and FIGS. 2A-F, 3A-E, 4A-E, 5A-C, 6A-D, and 7A-B are schematic circuit diagrams of the commercially available Doble Engineering TR3000 automatic power factor indicator embodying the invention, incorporated by reference herein.

With reference now to the drawings and more particularly FIG. 1 thereof, there is shown a block diagram illustrating the logical arrangement of a system according to the invention for providing indications representative of imaginary and real components of an unknown impedance, such as represented by ungrounded capacitor 12 of capacitance $C_x$ and ungrounded resistor 14, of resistance $R_x$.

This system 10 includes a test signal source 16, typically providing a 100 volt rms sine wave signal of frequency 976.6 Hz significantly higher than both the 50 and 60 Hz power frequency and unharmonically related to both. Shielded cables 18 and 20 define an unknown terminal pair for receiving the unknown impedance, such as capacitor 12 of capacitance $C_x$ and resistor 14 of resistance $R_x$. Shielded conductor 20 is connected between the unknown impedance and the − input of operational amplifier 22 comprising a measuring detector having its output coupled to the + input 32X of combiner 32.

Test signal source 16 also energizes the reference impedance comprising capacitor 24 of capacitance $C_N$ and resistor 26 of resistance $R_N$. Operational amplifier 28 has its − input connected to reference capacitor 24 and its output connected to digital attenuator 34 whose output is connected to a − input 32I of combiner 32. Similarly operational amplifier 30 comprising the reference real detector has its − input connected to reference resistor 26 and its output coupled to the input of real digital attenuator 36 whose output is coupled to the other − input 32R of comparator 32. Imaginary digital attenuator 34 and real digital attenuator 36 provide analog signals representative of the counts in imaginary counter 70 and real counter 66, respectively.

Bandpass filter 38 centered at the test signal frequency of 976.6 Hz receives the signal on line 84 from combiner 32 as the input to phase sensitive detector 40. Band pass filter 42, also centered at the test signal frequency of 976.6 Hz receives the signal at the output of operational amplifier 30 and provides a reference signal to a second input of phase sensitive detector 40 at the input of phase-locked loop (PLL) phase generator 44 that provides signals in phase quadrature on outputs 44R and 44I representative of real and imaginary references, respectively, to a first switch SW1 46 that provides one of the reference components to switch SW3 48. Switch SW3 48 receives on one input the output of bandpass filter 38 multiplied by 1 by multiplier 50 and by −1 from multiplier 52, respectively, and transfers one of these signals to a lowpass filter comprising resistor 54 and capacitor 56 to control the frequency of voltage-controlled oscillator (VCO) 5 that delivers clock pulses to switch SW2 62 and to up/down amplifier 60. The imaginary clock output 68 and real clock output 64 of switch SW2 62 are coupled to the imaginary clock and real clock inputs of imaginary counter 70 and real counter 66, respectively. The output of up/down amplifier 60 is coupled to the up/down inputs of counters 66 and 70.

Having described the physical arrangement of the system according to the invention, its mode of operation will be discussed. Initially counter 66 is set to zero, switch 46 is set to provide the signal on line 44I to switch SW3 48, and switch SW2 62 furnishes clock pulses on imaginary clock line 68 to imaginary counter 70.

With counter 66 set to zero, the signal on output line 84 of comparator 32 is an error signal corresponding to the difference between the signal provided by operational amplifier 22 and the output of imaginary digital attenuator 34. The output of imaginary digital attenuator 34 corresponds to the detected imaginary reference current flowing through reference capacitor 24 attenuated by a factor corresponding to the count in counter 70.

PLL phase generator 44 provides two square-wave signals in phase quadrature at test signal frequency on lines 44R and 44I, respectively, to switch SW1 46. Switch SW1 46 then selects the signal on output 44I for delivery to switch SW3 48 which switches back and forth between the outputs of 1 multiplier 50 and −1 multiplier 52 so as to provide on the output of switch 48 a signal through effective synchronous rectification having a D.C. component corresponding to the imaginary component of the unknown signal on input 32X of magnitude and polarity of the amount and direction of error, respectively. The lowpass filter comprising resistor 54 and capacitor 56 reduces ripple so that the D.C. signal applied to the input of VCO 58 causes the latter to provide clock pulses at a frequency proportional to this magnitude. The signal from up/down amplifier 60 then provides a signal to imaginary counter 70 to advance or retard the count in response to clock pulses so as to reduce the error until the frequency of VCO 58 clock pulses is essentially zero to establish a stable condition.

Switch SW1 46 and switch SW2 62 are then repositioned so that the former selects the in-phase reference on line 44I and the latter provides the clock pulses to output line 64. Only real counter 66 then receives count-changing signals. Output 84 of comparator 32 then provides an error signal that is representative of the difference between the detected unknown signal on input 32X and the detected imaginary reference signal as attenuated by imaginary digital attenuator 34 and the detected real reference signal as attenuated by real digital attenuator 36. The count in real counter 66 then changes in the manner described above in connection with changing the count in imaginary counter 70 with the D.C. component at the output of switch SW3 48 functioning as a synchronous rectifier to provide a signal representative of the real error signal until this magnitude goes to zero. The count in counter 66 is then representative of the real component of the unknown impedance.

While the counts in counters 70 and 66 may be typically within approximately 0.1% of the actual values of the imaginary and real components of the unknown impedance after a single iteration, it may be desirable to perform additional iterations without resetting either counter, typically performing four iterations.

The counts in counters 70 and 66 typically correspond to the ratio of the unknown capacitance $C_x$ to the reference capacitance $C_N$ and the unknown resistance $R_x$ to the reference resistance $R_N$, and the absolute values of these unknown components may be readily determined by processing these counts with a suitable data processor in a manner well known to those skilled in the art, not shown and not a part of this invention. Similarly, the power factor may be readily determined in accordance with the general definition at the frequency of interest of the unknown impedance, usually power frequency.

The invention has a number of advantages. Using a test frequency significantly above and unharmonically related to the power frequency together with bandpass filtering at test signal frequency reduces errors caused by noise components at power frequency. The specific test signal frequency described of 976.6 Hz is especially advantageous because it is unharmonically related to both 50 Hz and 60 Hz, the most common power frequencies used in the world.

Referring to FIGS. 2A-F, 3A-E, 4A-E, 5A-C, 6A-D, and 7A-B there are shown schematic circuit diagrams of a commercial embodiment of the invention. In this embodiment lines labelled REALSEL carry the same binary signal. This signal typically is binary ZERO for determining the imaginary component and binary ONE for determining the real component. Other lines designated HOLD, OUTPUT *, CONTACT 1, and RANGEHI also receive respective 1-bit binary signals that may be part of a control word signal furnished by a central processor, not shown or described herein so as to avoid obscuring the principles of the invention, typically embodied in the commercially available Doble Engineering TR 3000 family slave instrument.

Typically with the HOLD bit at binary ZERO, counters 66 and 70 may be adjusted. When ONE the count in counters 66 and 70 remain fixed so that the central processor unit may read these counts.

Typically when the OUTPUT* signal is at binary ZERO, test signal source 16 provides the test signal, while with this bit signal at binary ONE, source 16 provides no test signal.

Typically when the CONTACT 1 bit signal is binary ZERO, a first unknown impedance is selected for measuring while when at binary ONE, a second unknown impedance may be measured.

The RANGEHI bit signal allows selection of a reference capacitor 24 for measuring unknown capacitances in a high test range of approximately 300 to 11000 PF when at binary ONE and a low capacitance test range of approximately 0 to 2500 pF when carrying binary ZERO.

Other embodiments are within the claims:
What is claimed is:
1. Automatic bridge balancing apparatus comprising,
a reference impedance,
a measuring terminal pair for receiving an unknown impedance characterized by at least one parameter, a source of a test signal coupled to said reference impedance and to said measuring terminal pair in parallel for energizing said reference impedance and said unknown impedance, a measuring detector connected in series with said unknown impedance when said unknown impedance is connected to said measuring terminal pair for providing a measured signal representative of the current flowing through said unknown impedance when energized by said test signal, at least one reference detector connected in series with said reference impedance for providing a reference signal characteristic of the current flowing through said reference impedance when energized by said test signal, a combiner having at least a measuring input and at least one reference input for combining the measured signal with the reference signal to provide at least one error signal, each reference detector including an up/down counter coupled to a digital attenuator that is coupled to a reference input of said combiner, and a controller having an input coupled to said combiner and an output coupled to each up/down counter for controlling the count in each up/down counter so that the associated digital attenuator provides a signal to the associated reference input of said combiner that minimizes an associated error signal so that the count in the associated counter is then characteristic of an unknown impedance parameter.

2. Automatic bridge balancing apparatus in accordance with claim 1 wherein said apparatus is arranged to be connected to a source of electrical power having a power line frequency and the frequency of said test signal is significantly above and unharmonically related to said power frequency.

3. Automatic bridge balancing apparatus in accordance with claim 2 wherein said power frequency is a power frequency from the group consisting of 50 and 60 Hz.

4. Automatic bridge balancing apparatus in accordance with claim 3 wherein the frequency of said test signal is 976.6 Hz.

5. Automatic bridge balancing apparatus in accordance with claim 1 wherein the reference impedance parameters comprise a reference real component associated with a reference resistance and a reference imaginary component associated with a reference reactance, said reference detector comprises a reference imaginary detector and reference real detector coupled to the reference reactance and reference resistance respectively for providing reference imaginary and reference real signals respectively characteristic of the current flowing in the resistance and reactance components respectively of said reference impedance, said combiner has a reference imaginary input and a reference real input, said reference imaginary and reference real detectors include imaginary and real up/down counters respectively coupled to imaginary and real digital attenuators respectively that are coupled to said reference imaginary and reference real inputs respectively of said combiner, said combiner constructed and arranged to provide imaginary and real error signals respectively representative of the difference between the imaginary components of the unknown and reference signals and the difference between the real components of the unknown and reference signals, said controller being responsive to the imaginary and real error signals to control the count in the imaginary and real counters respectively so that the associated digital attenuators provide signals to the reference imaginary and reference real inputs of said combiner that minimize the imaginary error and real error signals respectively so that the count in the imaginary counter and in the real counter is then characteristic of the imaginary and real components respectively of the unknown impedance and the power factor thereof.

6. Automatic bridge balancing apparatus in accordance with claim 5 and further comprising a bandpass filter centered at the frequency of the test signal having an input coupled to the output of said combiner for providing a filtered error signal at the test signal frequency, a clock pulse source for providing clock pulses of a controllable clock pulse frequency having an output and a control input, the clock pulse source control input being coupled to the bandpass filter output for receiving said filtered error signal to control the clock pulse frequency proportional to the magnitude of the filtered error signal, circuitry coupling the output of the clock pulse source to the imaginary and real up/down counters for advancing and retarding the count in the respective imaginary and real counters so as to reduce the error signal.

7. Automatic bridge balancing apparatus in accordance with claim 6 and further comprising switching circuitry for directing clock signals from the clock signal source to said imaginary and said real up/down counters during mutually exclusive time intervals.

8. Automatic bridge balancing apparatus in accordance with claim 7 and further comprising means for initially setting the signal on the reference real input to zero and minimizing said imaginary error signal, then maintaining the signal on said reference imaginary input fixed, and then minimizing said real error signal.

9. Automatic bridge balancing apparatus in accordance with claim 8 and further comprising means for maintaining the signal then on said reference real input unchanged and altering the count in said imaginary up/down counter to reduce the imaginary error signal.

10. Automatic bridge balancing apparatus in accordance with claim 9 and further comprising, means for maintaining the signal then on said imaginary input unchanged and altering the count in said real up/down counter to reduce said real error signal.

11. Automatic bridge balancing apparatus comprising, a reference impedance, a measuring terminal pair for receiving an unknown impedance characterized by at least one parameter, a source of a test signal coupled to said reference impedance and to said measuring terminal pair in parallel for energizing said reference impedance and said unknown impedance, a measuring detector connected in series with said unknown impedance when said unknown impedance is connected to said measuring terminal pair for providing a measured signal representative of the current flowing through said unknown impedance when energized by said test signal, at least one reference detector connected in series with said reference impedance for providing a reference signal characteristic of the current flowing through said reference impedance when energized by said test signal, a combiner having at least a measuring input and at least one reference input for combining the measured signal with the reference signal to provide at least one error signal, each reference detector including a controllable variable impedance that is coupled to a reference input of said combiner, and a controller having an input coupled to said combiner and an output coupled to said controllable variable impedance for providing a signal to the associated reference input of said combiner that minimizes an associated error signal so that said controllable variable impedance is then characteristic of an unknown impedance parameter, the frequency of said test signal being significantly above and unharmonically related to power line frequency.

12. Automatic bridge balancing apparatus in accordance with claim 11 wherein said power frequency is a power frequency from the group consisting of 50 and 60 Hz.

13. Automatic bridge balancing apparatus in accordance with claim 12 wherein said power frequency is 60 Hz wherein the frequency of said test signal is 976.6 Hz.

14. A method of automatic bridge balancing which method includes the steps of, energizing a reference impedance and an unknown impedance in parallel with a test signal to provide a reference signal representative of the current flowing through said reference impedance and a measured signal representative of the current flowing through said unknown impedance, digitally attenuating said reference signal with a digital attenuator to provide a digitally attenuated reference signal, combining the measured signal with the digitally attenuated reference signal to provide at least one error signal, applying said error signal to a controller to adjust the attenuation of said digital attenuator to reduce said error signal, and indicating the degree of attenuation of said digital attenuator when said error signal is a minimum to provide a representation of a parameter of said unknown impedance.

15. A method in accordance with claim 14 and further including the step of adjusting the frequency of said test signal to be significantly above and unharmonically related to power line frequency.

16. A method in accordance with claim 15 and further including the step of adjusting the frequency of said test signal to substantially 976.6 Hz.

17. A method in accordance with claim 14 and further including the step of applying said test signal to said reference impedance to provide reference imaginary and reference real signals respectively characteristic of the current flowing in resistance and reactive components respectively of said reference impedance, digitally attenuating both said reference imaginary and said reference real signals to provide attenuated reference imaginary and attenuated reference real signals, combining said reference imaginary and said reference real signals with said measured signal to provide imaginary and real error signals respectively, applying said imaginary and real error signals to said controller to control the attenuation of said reference imaginary and reference real signals, and indicating the degree of attenuation of said reference imaginary and reference real signals when said reference error and reference real signals are minimized to provide an indication of resistive and reactive components of said unknown impedance.

* * * * *